(12) United States Patent
Li

(10) Patent No.: US 11,158,612 B2
(45) Date of Patent: *Oct. 26, 2021

(54) ELECTRONIC DEVICE

(71) Applicant: GIO Optoelectronics Corp, Tainan (TW)

(72) Inventor: Chin-Tang Li, Tainan (TW)

(73) Assignee: GIO OPTOELECTRONICS CORP., Tainan (TW)

(*) Notice: Subject to any disclaimer, the term of this patent is extended or adjusted under 35 U.S.C. 154(b) by 2 days.

This patent is subject to a terminal disclaimer.

(21) Appl. No.: 16/830,859

(22) Filed: Mar. 26, 2020

(65) Prior Publication Data

US 2020/0227391 A1 Jul. 16, 2020

Related U.S. Application Data

(63) Continuation-in-part of application No. 16/254,967, filed on Jan. 23, 2019, now Pat. No. 10,615,185.

(60) Provisional application No. 62/620,730, filed on Jan. 23, 2018.

(51) Int. Cl.
  *H01L 25/075* (2006.01)
  *H01L 27/12* (2006.01)
  *H01L 33/62* (2010.01)

(52) U.S. Cl.
  CPC ...... *H01L 25/0753* (2013.01); *H01L 27/1214* (2013.01); *H01L 27/1244* (2013.01); *H01L 27/1255* (2013.01); *H01L 33/62* (2013.01)

(58) Field of Classification Search
  CPC .. H01L 25/075; H01L 27/3251; H01L 27/326
  See application file for complete search history.

(56) References Cited

U.S. PATENT DOCUMENTS

| | | | |
|---|---|---|---|
| 10,615,185 B2* | 4/2020 | Li | H01L 27/3251 |
| 2016/0065145 A1* | 3/2016 | Nakashima | H01L 23/49844 |
| | | | 330/289 |
| 2017/0187976 A1* | 6/2017 | Cok | G09G 3/3611 |

* cited by examiner

*Primary Examiner* — Farun Lu
(74) *Attorney, Agent, or Firm* — Muncy, Geissler, Olds & Lowe, P.C.

(57) ABSTRACT

An electronic device comprises at least one sub matrix unit, a driving circuit board, and at least one surface mount device. The sub matrix unit comprises a substrate, thin-film circuits and first connecting pads. The thin-film circuits and the first connecting pads are disposed on the operation face of the substrate. The sub matrix unit defines a loading face and comprises second connecting pads, at least one first conductive line, and at least one second conductive line all together arranged on the loading face. A second height defined between a top of the surface mount device and the loading face of the driving circuit board is no less than a first height defined between an uppermost face of the sub matrix unit and the loading face of the driving circuit board.

16 Claims, 18 Drawing Sheets

```
┌─────────────────────────────────────────────────────────┐
│ providing at least a sub matrix unit, wherein the sub   │ S01
│ matrix unit comprises a substrate, a plurality of       │
│ thin-film circuits and a plurality of first connecting  │
│ pads, the thin-film circuits and the first connecting   │
│ pads are disposed on the substrate, each of the         │
│ thin-film circuits comprises at least a thin-film       │
│ transistor and at least a conductive line, the thin-film│
│ transistor is electrically connected with the conductive│
│ line, and the first connecting pads are electrically    │
│ connected with the thin-film transistor through the     │
│ conductive line                                         │
└─────────────────────────────────────────────────────────┘
                            │
                            ▼
┌─────────────────────────────────────────────────────────┐
│ disposing the sub matrix unit on a driving circuit      │ S02
│ board, wherein the driving circuit board comprises a    │
│ plurality of second connecting pads, at least one first │
│ conductive line, and at least one second conductive     │
│ line, the second connecting pads are facing to the      │
│ corresponding ones of the first connecting pads and     │
│ connected to the corresponding ones of the first        │
│ connecting pads in a respective manner, and the first   │
│ conductive line and the second conductive line are      │
│ correspondingly and electrically connected with the     │
│ first connecting pads through the second connecting pads│
└─────────────────────────────────────────────────────────┘
                            │
                            ▼
┌─────────────────────────────────────────────────────────┐
│ disposing at least a surface mount device on the        │ S03
│ driving circuit board, wherein the surface mount device │
│ is electrically connected with the corresponding ones of│
│ the first connecting pads through the corresponding ones│
│ of the second connecting pads, wherein the corresponding│
│ ones of the second connecting pads connect with the     │
│ surface mount device                                    │
└─────────────────────────────────────────────────────────┘
```

FIG. 1

ELECTRONIC DEVICE

CROSS REFERENCE TO RELATED APPLICATIONS

This application is a Continuation-In-Part (CIP) of an earlier filed, pending, application, having application Ser. No. 16/254,967 and filed on Jan. 23, 2019, which claims benefit of U.S. Provisional Application No. 62/620,730, filed on Jan. 23, 2018, the content of which, including drawings, is expressly incorporated by reference herein.

BACKGROUND

Technology Field

The present disclosure relates to an electronic device and, in particular, to an electronic device with a sub matrix unit.

Description of Related Art

In general, the LED display apparatus usually adopts the passive matrix (PM) driving method to drive the LEDs to emit light. However, the large-sized display apparatus comprises lots of first conductive lines and second conductive lines, and lots of scan drivers and data drivers are required for actuating these first conductive lines and second conductive lines. Accordingly, the conventional PM display apparatus costs high.

SUMMARY

In view of the foregoing, this disclosure is to provide a novel electronic device and, in particular, a display apparatus. Compared with the conventional PM display apparatus, the manufacturing cost of the display apparatus in the current disclosure would be reduced with remaining the size of the display apparatus.

The present disclosure provides an electronic device, comprising at least one sub matrix unit, a driving circuit board, and at least one surface mount device. The sub matrix unit comprises a substrate, at least one thin-film circuit and a plurality of first connecting pads. The at least one thin-film circuit and the first connecting pads are disposed on the substrate. The at least one thin-film circuits comprises at least one thin-film transistor and at least one conductive line. The thin-film transistor is electrically connected with the conductive line, and the first connecting pads are electrically connected with the thin-film transistor through the conductive line. The sub matrix unit is disposed on the driving circuit board. The driving circuit board defines a loading face, and comprises a plurality of second connecting pads, at least one first conductive line, and at least one second conductive line all together arranged on the loading face. The second connecting pads are corresponding to ones of the first connecting pads and electrically connected to the corresponding ones of the first connecting pads in the respective manner. The first connecting pad is disposed between the second connecting pad and the substrate. The first conductive line and the second conductive line are correspondingly and electrically connected with the first connecting pads through the second connecting pads. The surface mount device is disposed on the loading face of the driving circuit board and is adjacent to the at least one sub matrix unit. The surface mount device is electrically connected with the corresponding ones of the first connecting pads through corresponding ones of the second connecting pads, in which the corresponding ones of the second connecting pads connect with the surface mount device. The surface mount device defines a top contrary to the loading face of the driving circuit board. The substrate defines an uppermost face contrary to the loading face of the driving circuit board. A first height is defined between the uppermost face of the at least one sub matrix unit and the loading face of the driving circuit board, and a second height is defined between the top of the at least one surface mount device and the loading face of the driving circuit board. The second height is no less than the first height.

In some embodiments, the substrate is a rigid board or a flexible board.

In some embodiments, the first connecting pad is disposed between the second connecting pad and the substrate.

In some embodiments, the surface mount device comprises a plurality of light-emitting diodes and a plurality of third connecting pads, the light-emitting diodes are disposed in correspondence with the thin-film circuits of the sub matrix unit, and the light-emitting diodes are electrically connected with corresponding ones of the second connecting pads of the driving circuit board through the third connecting pads.

In some embodiments, at least one of the first connecting pads is at least partially overlapped with the corresponding thin-film transistor.

In some embodiments, the at least one thin-film transistor of the at least one thin-film circuit is electrically connected with one of the first conductive lines of the driving circuit board.

In some embodiments, the at least one thin-film transistor of the at least one thin-film circuit is electrically connected with one of the second conductive lines of the driving circuit board.

In some embodiments, the sub matrix unit further comprises a trace and a plurality of fourth connecting pads, the trace and the fourth connecting pads are disposed on the substrate, and the driving circuit board has a plurality of conductive segments, in which the conductive segments are electrically connected with each other through the trace and the fourth connecting pads.

In some embodiments, one of the sub matrix units controls a plurality of surface mount devices.

This disclosure also provides an electronic device, comprising at least one sub matrix unit and a driving circuit board. The sub matrix unit includes a substrate, at least one thin-film circuit, and a plurality of first connecting pads. The at least one thin-film circuit and the first connecting pads are disposed on the substrate. The at least one thin-film circuit includes at least one thin-film transistor and at least one conductive line. The at least one thin-film transistor is electrically connected with the conductive line, and the first connecting pads are electrically connected with the thin-film transistor through the conductive line. The sub matrix unit is disposed on the driving circuit board. The driving circuit board includes a plurality of second connecting pads, at least one first conductive line, and at least one second conductive line. The second connecting pads corresponds to ones of the first connecting pads and electrically connect to the corresponding ones of the first connecting pads in a respective manner. The first conductive line and the second conductive line are correspondingly and electrically connected with the first connecting pads through the second connecting pads.

In some embodiments, the substrate is a rigid board or a flexible board.

In some embodiments, the first connecting pad is disposed between the second connecting pad and the substrate.

In some embodiments, at least one of the first connecting pads is at least partially overlapped with the corresponding thin-film transistor.

In some embodiments, the at least one thin-film transistor of the at least one thin-film circuit is electrically connected with one of the first conductive lines of the driving circuit board.

In some embodiments, the at least one thin-film transistor of the at least one thin-film circuit is electrically connected with one of the second conductive lines of the driving circuit board.

In some embodiments, the sub matrix unit further comprises a trace and a plurality of fourth connecting pads, the trace and the fourth connecting pads are disposed on the substrate, the driving circuit board has a plurality of conductive segments, and the conductive segments are electrically connected with each other through the trace and the fourth connecting pads.

As mentioned above, in the electronic device of this disclosure, the thin-film transistors are electrically connected with the conductive lines of the thin-film circuits of the sub matrix unit. The first connecting pads are electrically connected with the thin-film transistors through the conductive lines. In addition, the second connecting pads of the driving circuit board corresponds to ones of the first connecting pads to electrically connect with the corresponding ones of the first connecting pads in the respective manner. The first conductive lines and the second conductive lines are electrically connected with the first connecting pads through the second connecting pads; the surface mount device is electrically connected with the corresponding ones of the first connecting pads through the second connecting pads, in which the corresponding ones of the second connecting pads connect with the surface mount device. Therefore, the electronic device (e.g. a LED display apparatus) of one embodiment according to this disclosure can be an AM (active matrix) display apparatus. Compared with the conventional PM display apparatus, the AM (active matrix) display apparatus according to this disclosure can reduce the manufacturing cost thereby but keep remaining the size of the electronic device.

Moreover, the second height defined between the top of the at least one surface mount device and the loading face of the driving circuit board is no less than the first height defined between the uppermost face of the at least one sub matrix unit and the loading face of the driving circuit board.

Furthermore, in the electronic device according to one embodiment of this disclosure, at least one sub matrix unit in correspondence with at least one surface mount device can construct at least one electronic unit; specifically, in the electronic device according to another one embodiment of this disclosure, at least one sub matrix unit in correspondence with at least one surface mount device can construct at least one display pixel. There are various embodiments: one or more sub matrix unit(s) arranged on the driving circuit board can construct one or more electronic unit(s), one sub matrix unit in correspondence with one surface mount device can construct one electronic unit (such as a display pixel), one sub matrix unit in correspondence with a plurality of surface mount devices can construct a plurality of electronic units (such as display pixels), or two or more sub matrix units in correspondence with a plurality of surface mount devices can construct a plurality of electronic units (such as display pixels). These configurations can achieve the advantages of low cost and efficient combinations. As a result, there is no need to design a specific manufacturing process for the size of each final product in this disclosure. Accordingly, the manufacturing process according to this disclosure is simplified and budget, and provides the flexibility for various product requirements.

BRIEF DESCRIPTION OF THE DRAWINGS

The disclosure will become more fully understood from the detailed description and accompanying drawings, which are given for illustration only, and thus are not limitative of the present disclosure, and wherein:

FIG. 1 is a flow chart of a manufacturing method of a display apparatus according to an embodiment of this disclosure;

DETAILED DESCRIPTION OF THE DISCLOSURE

Figure 2A:
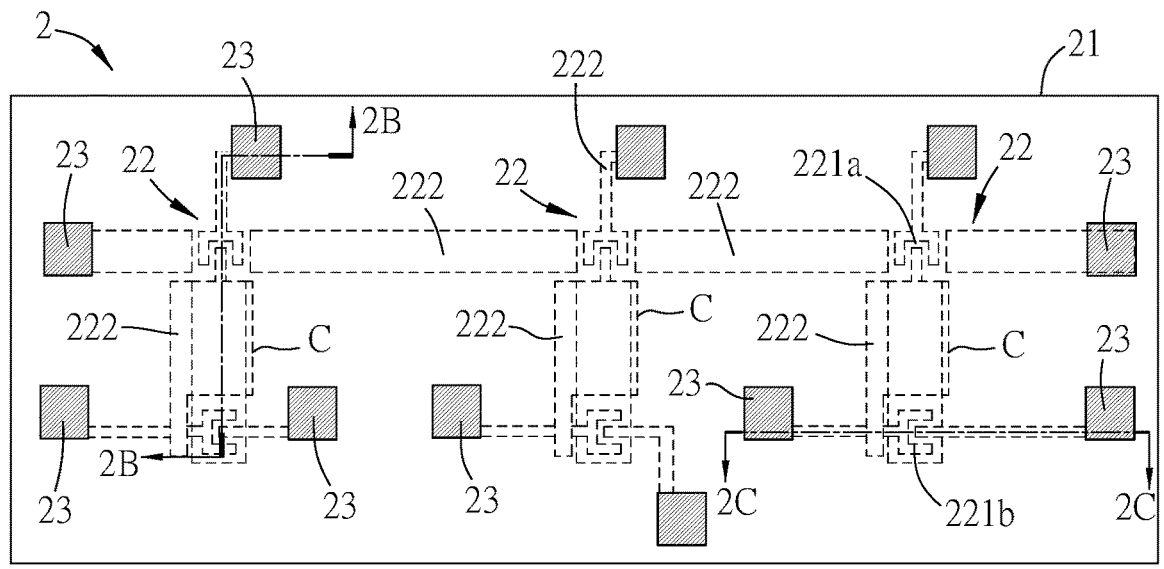
FIGS. 2A, 2D, 2E and 2F are schematic diagrams showing the layouts of the display apparatus according to an embodiment of this disclosure during the manufacturing process.

The present disclosure will be apparent from the following detailed description, which proceeds with reference to the accompanying drawings, wherein the same references relate to the same elements.

This disclosure provides an electronic device, which can be a display apparatus. In the following embodiments, the electronic device is a display apparatus for examples. FIG. 1 is a flow chart of a manufacturing method of a display apparatus according to an embodiment of this disclosure. As shown in FIG. 1, the manufacturing method of a display apparatus of this disclosure comprises the following steps of: providing at least one sub matrix unit, wherein the sub matrix unit comprises a substrate, a plurality of thin-film circuits and a plurality of first connecting pads, the thin-film circuits and the first connecting pads are disposed on the substrate, each of the thin-film circuits comprises at least one thin-film transistor and at least one conductive line, the thin-film transistor is electrically connected with the conductive line, and the first connecting pads are electrically connected with the thin-film transistor through the conductive line (step S01); disposing the sub matrix unit on a driving circuit board, wherein the driving circuit board comprises a plurality of second connecting pads, at least one first conductive line (here in this embodiment is at least one scan line), and at least one data line (here in this embodiment is at least one second conductive line), the second connecting pads are facing to corresponding ones of the first connecting pads and connected to the corresponding ones of the first connecting pads in a respective manner, and the first conductive line and the second conductive line are correspondingly and electrically connected with the first connecting pads through the second connecting pads (step S02); and disposing at least one surface mount device on the driving circuit board, wherein the surface mount device is electrically connected with the corresponding ones of the first connecting pads through the corresponding ones of the second connecting pads, in which the corresponding ones of the second connecting pads connect with the surface mount device (step S03).

In some embodiments, in the step of disposing the surface mount device on the driving circuit board (step S03), one of the sub matrix units controls a plurality of surface mount devices. In some embodiments, in the step of disposing the surface mount device on the driving circuit board (step S03), one of the sub matrix units controls a plurality of surface mount devices could be further elaborated as each of the sub matrix units controls a plurality of surface mount devices.

In some embodiments, the substrate can be an insulation substrate or a conductive substrate with an insulation layer. In some embodiments, the substrate can be a rigid board or a flexible board. If the substrate is a flexible board, a rigid carrier is needed for supporting the flexible board in the consequent manufacturing processes to form components on the flexible board. In more detailed, the flexible board is formed on the rigid carrier, and then the consequent manufacturing processes are performed to form components on the flexible board. Afterwards, the rigid carrier is removed. If the substrate is a rigid board, the above process is not needed.

Figure 2B:
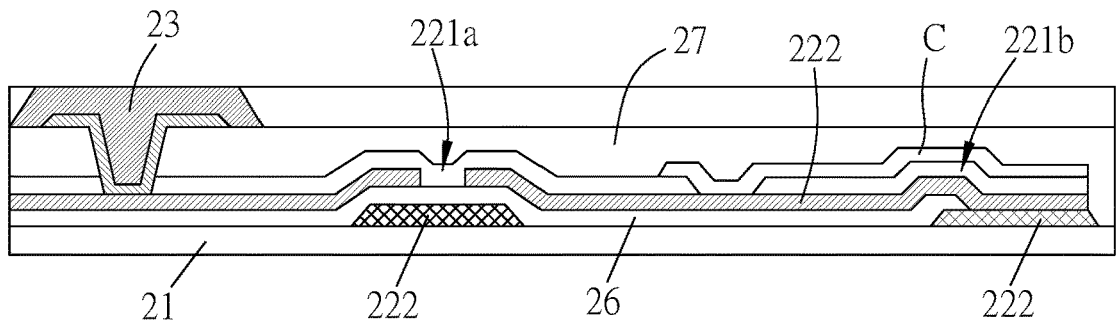
FIG. 2B is a sectional view of the sub-matrix unit of FIG. 2A along the line 2B-2B.
Figure 2C:
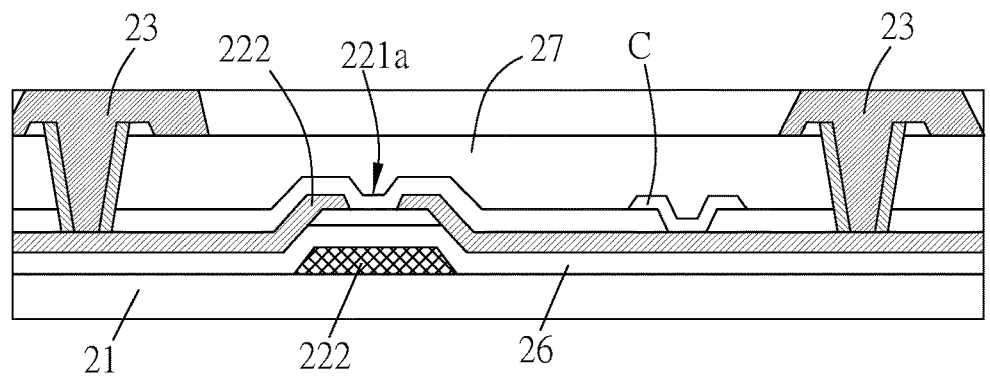
FIG. 2C is a sectional view of the sub-matrix unit of FIG. 2A along the line 2C-2C.

The detailed technical contents of the above-mentioned steps will be described hereinafter with reference to FIG. 1 in view of FIGS. 2A to 2F. FIGS. 2A, 2D, 2E and 2F are schematic diagrams showing the layouts of the display apparatus according to an embodiment of this disclosure during the manufacturing process, FIG. 2B is a sectional view of the sub matrix unit of FIG. 2A along the line 2B-2B, and FIG. 2C is a sectional view of the sub matrix unit of FIG. 2A along the line 2C-2C.

The manufacturing method of a display apparatus of this disclosure is described as follow.

Firstly, at least one sub matrix unit 2 is provided (step S01). As shown in FIGS. 2A to 2C, the sub matrix unit 2 comprises a substrate 21, a plurality of thin-film circuits 22, and a plurality of first connecting pads 23. The thin-film circuits 22 and the first connecting pads 23 are disposed on the substrate 21 as illustrated in FIG. 2A. In this embodiment, three thin-film circuits 22 are formed on the substrate 21, but this disclosure is not limited thereto. In other embodiments, the amount of the configured thin-film circuits 22 can be one, two, or more than three, and can be determined to meet requirements of designs. On the other hand, the sub matrix unit 2 is literally elaborated with a unit having one or more thin-film circuit(s) 22. In this embodiment, each thin-film circuit 22 comprises one thin-film transistor 221a and one thin-film transistor 221b, and a plurality of conductive lines 222. The thin-film transistors 221a and 221b are electrically connected with the conductive lines 222, respectively, and the first connecting pads 23 are electrically connected with the thin-film transistors 221a and 221b through the conductive lines 222, respectively. The amount of the thin-film transistors would not be limited.

The substrate 21 could be made of glass, resin, metal, ceramics, or composite materials. Herein, the resin, per se, is capable of flexibility, and may comprise organic polymer material with certain range of the glass transition temperature (Tg). The glass transition temperature (Tg) of the organic polymer material is, for example, between 250° C. and 600° C., and preferably between 300° C. and 500° C. Since the organic polymer material has a relative higher glass transition temperature, the following thin-film processes with relative higher temperature are possibly performed to form the thin-film transistors and other components or wires on the substrate 21. The organic polymer material can be a thermoplastic material, such as polyimide (PI), polyethylene (PE), polyvinylchloride (PVC), polystyrene (PS), acrylic, fluoropolymer, polyester, or nylon. In some embodiments, the flexible material (e.g. PI) can be provided on a rigid carrier by adhesion or coating, and then cured (by thermal curing, light curing, or the like) to form a flexible substrate 21 (flexible board). Then, the substrate 21 can be subjected to the following thin-film processes. Afterwards, the rigid carrier is removed. Herein, the rigid carrier can be, for example but not limited to, a glass plate, a ceramic plate, a metal plate, or a quartz plate.

In this embodiment, the thin-film circuits 22 can be formed on the substrate 21 by a thin-film process, such as a low-temperature polycrystalline silicon (LTPS) process, an amorphous silicon (α-Si) process, or a metal oxide semiconductor process (e.g. IGZO), and this disclosure is not limited thereto. The thin-film transistors 221a and 221b and the conductive lines 222 can be directly formed on the substrate 21. Alternatively, the thin-film transistors 221a and 221b and the conductive lines 222 can be indirectly formed on the substrate 21. For example, a buffer layer or an insulation layer can be provided upon the substrate 21 and below the thin-film transistors 221a and 221b and the conductive lines 222, and this disclosure is not limited thereto. In some embodiments, the conductive lines 222 may be a single layer or a multilayer structure made of a metal (e.g. aluminum, copper, silver, molybdenum, or titanium) or an alloy thereof. Alternatively, the conductive lines 222 may also comprise a transparent conductive material (e.g. indium zinc oxide (IZO)).

A part of the conductive lines 222 can construct the sources or drains of the thin-film transistors 221a and 221b, the first conductive lines, the second conductive lines, the pixel electrodes, or other electrical connecting wires or circuits, and this disclosure is not limited thereto. In some embodiments, the conductive lines 222 can be electrically connected with the thin-film transistors 221a and 221b directly, or be electrically connected with the thin-film transistors 221a and 221b via other conductive layers (indirectly). In addition, the conductive lines 222 can be a wire electrically connecting the thin-film transistors 221a and 221b. In addition, the conductive lines 222 can be a wire electrically connecting the thin-film transistors 221a and 221b to the first connecting pads 23 (or other components). In addition, two conductive lines 222 can be separated by an insulation layer for preventing the short circuit therebetween. This disclosure is not limited thereto. To be noted, the above-mentioned conductive lines 222 can be a group containing any conductive films, layers or wires (including the transparent or opaque parts) in the thin-film circuits 22 formed on the substrate 21.

In this embodiment, as shown in FIGS. 2B and 2C, the first connecting pads 23 and the thin-film transistors 221a and 221b are disposed at the same side of the substrate 21. In addition to the thin-film transistors 221a and 221b, the conductive lines 222, and the first connecting pads 23, the thin-film circuits 22 can further comprise other films or layers, such as an insulation layer 26, a planar layer 27, and/or other layers (e.g. a protection layer). The thin-film circuit 22 of this embodiment is illustrated to be, for example, a 2T1C circuit structure, but this disclosure is not limited thereto. In other embodiments, the thin-film circuit 22 may have a different circuit structure, such as a 4T2C circuit structure or a 5T1C circuit structure. As shown in FIGS. 2A to 2C, each thin-film circuit 22 may include two thin-film transistors 221a and 221b, a plurality of conductive lines 222, and a capacitor C. The component connections of the 2T1C circuit structure is a well-known technology, so the detailed description thereof will be omitted.

Referring to FIG. 2A, the sub matrix unit 2 of this embodiment comprises three thin-film circuits 22 and eleven first connecting pads 23. These first connecting pads 23 individually cover a part of the conductive lines 222, so that the first connecting pads 23 can be electrically connected with the thin-film transistors 221a and 221b through the conductive lines 222. The material of the first connecting pads 23 can be, for example but not limited to, copper, silver, gold, their combinations, or any other suitable conductive material. In some embodiments, the first connecting pads 23 can be formed on the substrate 21 by printing, chemical plating, or electrical plating. In this embodiment, the sub matrix unit 2 is a flip-chip type surface mount device (SMD), which can be disposed on the driving circuit board by surface mount technology (SMT).

In some embodiments, in order to protect the thin-film circuit 22, a protection layer can be formed to cover the thin-film circuit 22. The protection layer can be formed by resin transfer molding (RTM), sealant dispensing, or any other suitable process. The protection layer is configured for preventing the external moisture or dusts from entering the thin-film circuit 22, which may damage the characteristics of the thin-film circuit 22. In some embodiments, the protection layer can be formed in the LTPS process of manufacturing the thin-film circuit 22. This design can further reduce the manufacturing cost. In some embodiments, the protection layer can be formed before or after the step of forming the first connecting pads 23, and this disclosure is not limited.

Figure 2D:
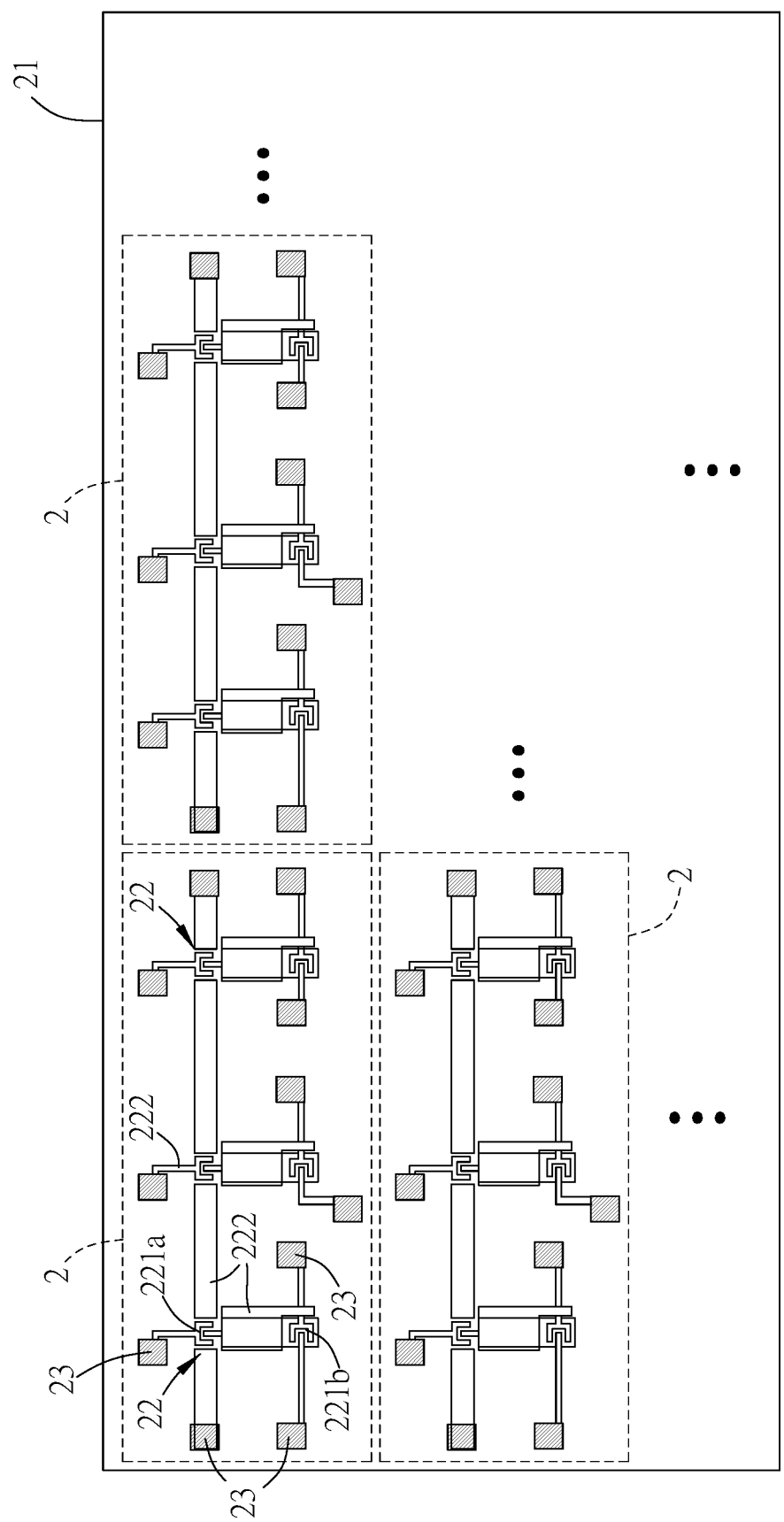

FIG. 2D is a schematic diagram showing the manufacturing of the sub matrix unit 2 of FIG. 2A. In order to obtain a plurality of sub matrix units 2, as shown in FIG. 2D, a plurality of thin-film circuits 22 (of a plurality of sub matrix units 2) can be formed on a mother substrate (a large-sized substrate 21). Next, a plurality of first connecting pads 23 corresponding to the plurality of thin-film circuit 22 (of the plurality of sub matrix units 2) are formed on the mother substrate 21, thereby a plurality of preparation zones are formed, and each of the preparation zones contains a to-be-formed sub matrix unit 2 including at least one of the thin-film circuits 22 and at least one of the first connecting pads 23. In the current embodiment, each of the preparation zones contains a to-be-formed sub matrix unit 2 including three the thin-film circuits 22 and eleven the first connecting pads 23. Finally, the mother substrate is cut between adjacent preparation zones so as to obtain a plurality of the sub matrix units 2. Since the size of the sub matrix unit 2 can be customized based on the design requirement, the entire mother substrate can be more sufficiently utilized and flexibly applicable.

Figure 2E:
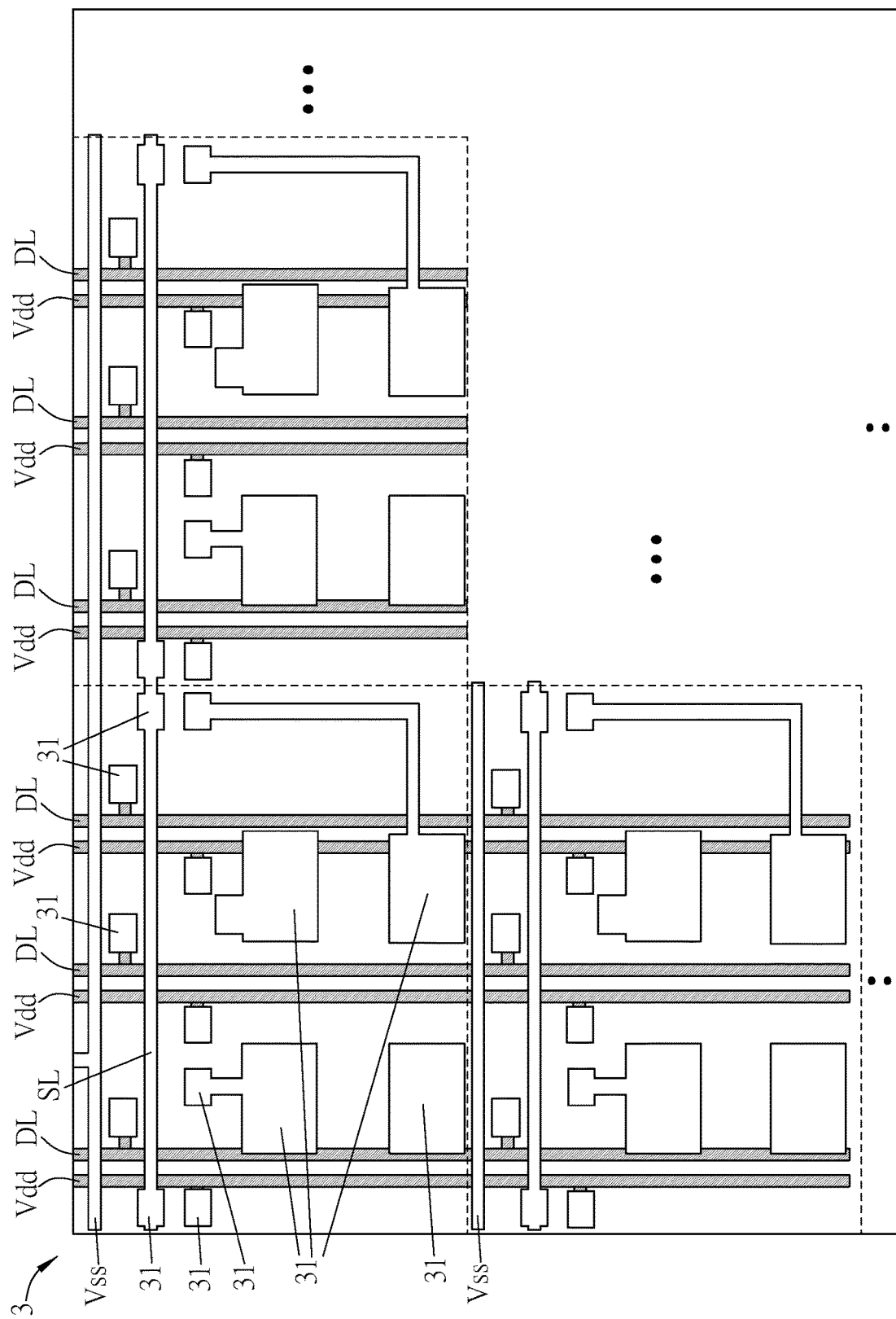

The driving circuit board will be described hereinafter with reference to FIG. 2E. In this embodiment, a driving circuit board 3 comprises at least one driving circuit corresponding to the sub matrix unit 2. The driving circuit comprises a plurality of second connecting pads 31, at least one first conductive line SL (e.g. a scan line for transmitting scan signals Vscan), at least one second conductive line DL (e.g. a data line for transmitting data signals Vdata), at least one power line (Vdd, for transmitting power voltages), and at least one ground line (Vss, for example, coupling to the ground). In this embodiment, the driving circuit board 3 as shown in FIG. 2E comprises a plurality of driving circuits (the dotted-line areas) in correspondence with a plurality of sub matrix units 2. Each driving circuit comprises one horizontal first conductive line SL, three vertical second conductive lines DL, three vertical power lines Vdd, one horizontal ground line Vss, and a plurality of second connecting pads 31. The horizontal first conductive line SL is connected to the first conductive line SL of the adjacent driving circuit, each horizontal ground line Vss is connected to the ground line Vss of the adjacent driving circuit, each vertical power line Vdd is connected to the power line Vdd of the adjacent driving circuit. To be noted, the first conductive line SL can be made by the same material and the same manufacturing process of the second connecting pads 31.

The material and manufacturing process of the driving circuit board 3 can be the same as or different from those of the sub matrix unit 2, and this disclosure is not limited thereto. In addition, the layout positions of the second connecting pads 31, the first conductive lines SL, the second conductive lines DL, the power lines Vdd and the ground lines Vss should refer to the layout positions of the thin-film circuits 22 and the first connecting pads 23 of the sub matrix unit 2. Accordingly, the second connecting pads 31 can face to and connect to the corresponding ones of the first connecting pads 23 when disposing the sub matrix unit 2 on the driving circuit board 3. The driving circuit board 3 can be a flexible circuit board or a rigid circuit board. The rigid circuit board can be a printed circuit board (PCB) or a metal circuit board (e.g. a metal core PCB, MCPCB). In addition, the driving circuit board 3 can comprise glass or plastic material, and this disclosure is not limited thereto. Moreover, the driving circuit board 3 can be a double layer circuit board or a single layer circuit. When the driving circuit board 3 is a double layer circuit board, an insulation layer is needed for separating the two conductive layers so as to prevent the short circuit therebetween. The driving circuit board 3 as shown in FIG. 2E is a double layer circuit board, but the insulation layer is not illustrated for making the drawing simpler.

Figure 2F:
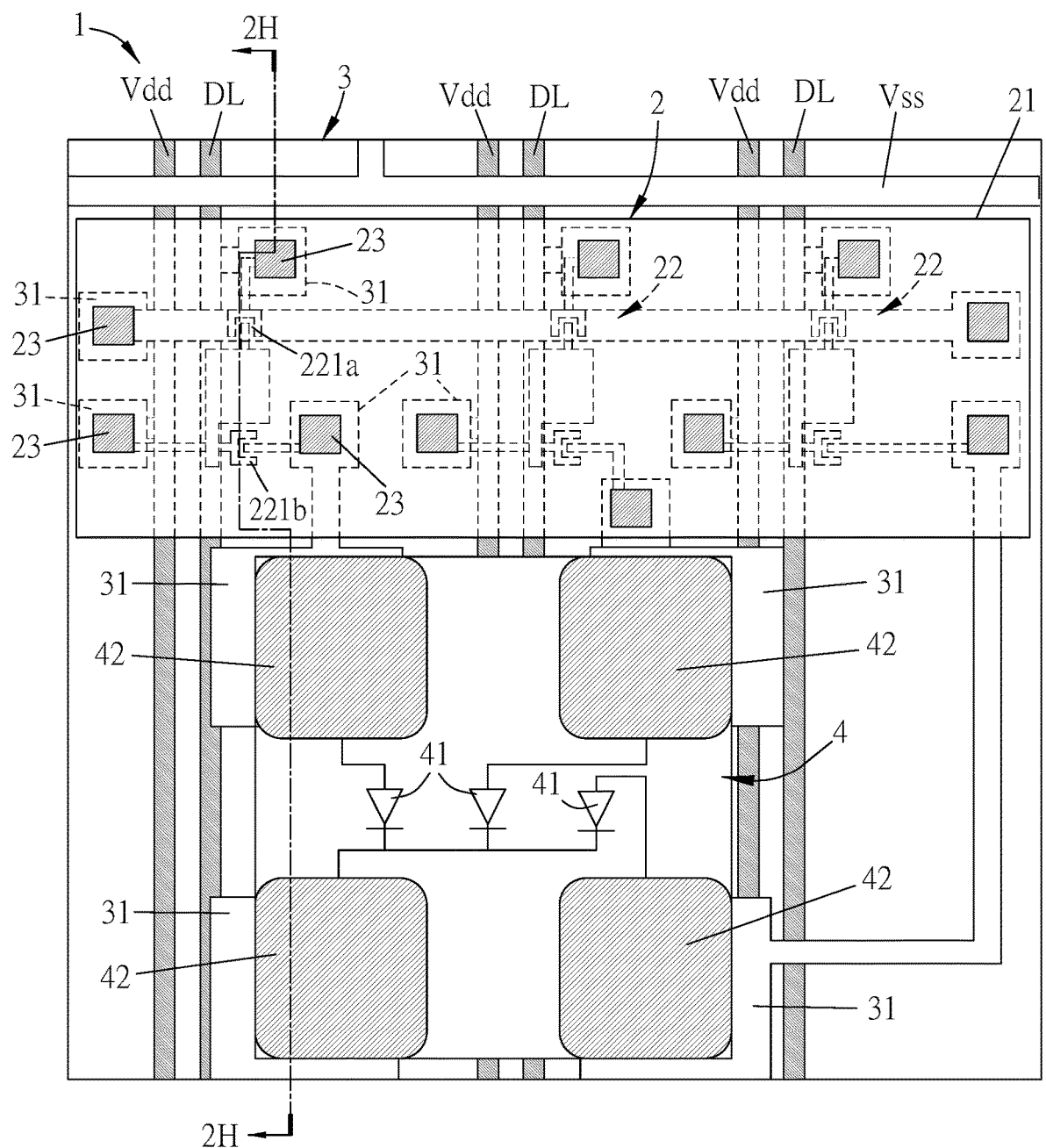

As shown in FIGS. 2E and 2F, the step S02 is to dispose one (or at least one) sub matrix unit 2 on the driving circuit board 3. In this embodiment, the corresponding ones of the first connecting pads 23 of the sub matrix unit 2 face to the second connecting pads 31 and are electrically connected with the second connecting pads 31. Accordingly, the first connecting pads 23, disposed between the substrate 21 and the second connecting pads 31, also electrically connect the substrate 21 and the second connecting pads 31. Herein, the corresponding ones of the first connecting pads 23 of the sub matrix unit 2 are electrically connected with the corresponding second connecting pads 31 of the driving circuit board 3 by a conductive material such as solder paste, silver paste, or copper paste (using surface mount technology). Accordingly, the first conductive lines SL and the second conductive lines DL can be electrically connected with the corresponding ones of the first connecting pads 23 through the second connecting pads 31. Furthermore, the first conductive lines SL and the second conductive lines DL can be electrically connected with the thin-film transistors 221a and 221b through the corresponding ones of the first connecting pads 23 and the second connecting pads 31. In this embodiment, the sub matrix unit 2 is reversed, so that the substrate 21 is at the top and the first connecting pads 23 is at the bottom to face to the driving circuit board 3. Then, the sub matrix unit 2 is directly disposed on the driving circuit board 3, so the thin-film transistors 221a and 221b of the three thin-film circuits 22 of the sub matrix unit 2 can be electrically connected with one first conductive line SL of the driving circuit board 3 through the first connecting pads 23 and the second connecting pads 31. Besides, the thin-film transistors 221a and 221b of the three thin-film circuits 22 can be also electrically connected with three second conductive lines DL of the driving circuit board 3, respectively, through the first connecting pads 23 and the second connecting pads 31.

The embodiment of FIG. 2F only shows one sub matrix unit 2 on the corresponding driving circuit of the driving circuit board 3. Of course, in other embodiments, a plurality of sub matrix units 2 can be respectively provided on a plurality of corresponding driving circuits of the driving circuit board 3 based on the design requirement.

Next, the step S03 is performed to dispose at least one surface mount device 4 on the driving circuit board 3. In this embodiment, the surface mount device 4 is disposed on the driving circuit board 3 by surface mount technology, and the surface mount device 4 is electrically connected with corresponding ones of the first connecting pads 23 through corresponding ones of the second connecting pads 31. For example, a heating process can be provided to melt the solder paste for electrically connecting the electrodes of the surface mount device 4 and the corresponding second connecting pads 31 of the driving circuit board 3, respectively.

In this embodiment, the surface mount device 4 comprises three light-emitting diodes 41 and four third connecting pads 42. The three light-emitting diodes 41 are disposed in correspondence with the three thin-film circuits 22, and each light-emitting diode 41 is electrically connected with the corresponding second connecting pad 31 of the driving circuit board 3 through the third connecting pad 42. Accordingly, each light-emitting diode 41 can be electrically connected with the thin-film transistor 221b through the second connecting pad 31 and the corresponding first connecting pad 23. As a result, the three thin-film circuits 22 of one sub matrix unit 2 can drive the three light-emitting diodes 41 of one surface mount device 4, respectively, to emit light. In some embodiment, the light-emitting diode 41 can emit, for example, red light, blue light, green light, UV light, IR light, or the light of another wavelength, and this disclosure is not limited thereto.

The three light-emitting diodes 41 of FIG. 2F have a common cathode design. In other embodiments, the three light-emitting diodes 41 may have a common anode design. To be noted, the above embodiment is to perform the step S03 after the step S02, but this disclosure is not limited thereto. In other embodiments, the step S03 can be performed before the step S02.

As shown in FIG. 2F, when the thin-film transistor 221a is turned on according to the scan signal transmitted from the first conductive line SL, the data signal from the second conductive line DL can be transmitted to the gate of the thin-film transistor 221b through the thin-film transistor 221a for turning on the thin-film transistor 221b. Then, the power voltage from the power line Vdd can pass through thin-film transistor 221b and be transmitted to the light-emitting diode 41 for enabling the light-emitting diode 41 to emit light. In this embodiment, the surface mount device 4 comprises three sub-pixels, and each sub-pixel comprises a light-emitting diode 41. The three light-emitting diodes 41 in three sub-pixels can be red, blue and green light-emitting diodes, respectively, thereby forming a full-color display pixel. Then, a full-color LED display apparatus can be manufactured. Of course, in other embodiments, the sub matrix unit can comprise less than or more than three thin-film circuits, and the proper surface mount device and driving circuit board can be selected according to the sub matrix unit. This disclosure is not limited thereto.

As mentioned above, the electronic device 1 of this embodiment comprises a sub matrix unit 2, a driving circuit board 3, and a surface mount device 4. For example, the electronic device 1 is a display apparatus. The sub matrix unit 2 comprises a substrate 21, three thin-film circuits 22, and a plurality of first connecting pads 23. The thin-film circuits 22 and the first connecting pads 23 are disposed on the substrate 21. Each of the thin-film circuits 22 comprises two thin-film transistors 221a and 221b and a plurality of conductive lines 222. The thin-film transistors 221a and 221b are electrically connected with the conductive lines 222, and the first connecting pads 23 are electrically connected with the thin-film transistors 221a and 221b through the conductive lines 222. In addition, the sub matrix unit 2 is disposed on the driving circuit board 3. The driving circuit board 3 comprises a plurality of second connecting pads 31, one first conductive line (scan line SL), and three second conductive lines (data lines DL). The second connecting pads 31 are disposed to face corresponding ones of the first connecting pads 23 and respectively connected to the corresponding ones of the first connecting pads 23. The first connecting pad 23 is disposed between the second connecting pad 31 and the substrate 21. The first conductive line (scan line SL) and the second conductive lines (data lines DL) are electrically connected with the corresponding first connecting pads 23 through the second connecting pads 31, respectively, so that the first conductive line scan line SL) and the second conductive lines (data lines DL) can be electrically connected with the thin-film circuits 22. The surface mount device 4 is disposed on the driving circuit board 3 and is adjacent to the sub matrix unit 2. The surface mount device 4 is electrically connected with the corresponding ones of the first connecting pads 23 through the corresponding ones of the second connecting pads 31, so that the surface mount device 4 can be electrically connected with the thin-film circuits 22. In this embodiment, the surface mount device 4 comprises three light-emitting diodes 41 and four third connecting pads 42. The three light-emitting diodes 41 are disposed in correspondence with the three thin-film circuits 22 of the sub matrix unit 2. The three light-emitting diodes 41 are electrically connected with the corresponding second connecting pads 31 of the driving circuit board 3 through the third connecting pads 42. Accordingly, the three light-emitting diodes 41 can be electrically connected with the thin-film transistor 221b of the sub matrix unit 2 through the corresponding first connecting pad 23. As a result, the three thin-film circuits 22 of the sub matrix unit 2 can drive the three light-emitting diodes 41 of the surface mount device 4, respectively, to emit light. To be noted, the surface mount device 4 could be an interface device electrically connected to a receiver or transmitter, which is set inside or outside the electronic device, such as a proximity sensor, including a capacitive sensor (such as a complementary metal-oxide-semiconductor), a capacitive displacement sensor, a doppler effect sensor (a sensor based on doppler effect), an inductive sensor, a magnetic sensor (including magnetic proximity), an optical sensor, a photoelectric sensor, a photocell sensor (reflective sensor), a laser rangefinder, a passive sensor (such as a charge-coupled device), a passive thermal infrared sensor, a reflection of ionizing radiation sensor, a sonar sensor (typically active or passive), an ultrasonic sensor, a fiber optics sensor, a Hall effect sensor and the like, such as a temperature sensors, including a thermal scanner, a thermocouple, a resistance thermometer, a silicon bandgap temperature sensor and the like; or the surface mount device 4 could be an interface device such as an X-ray detector, an antenna, or the like. The surface mount device 4 also could be a pressure sensor. The surface mount device 4 could be in small-scale sizes, such as mini-scale or micro-scale size, in this embodiment, but limited thereto. The surface mount device 4 can be comprehended as any electronic piece, not limited to mentioned examples, but adapted to surface mount technology.

The other technical contents of the electronic device 1 can be referred to the above embodiment, so the detailed description thereof will be omitted.

Figure 2G:
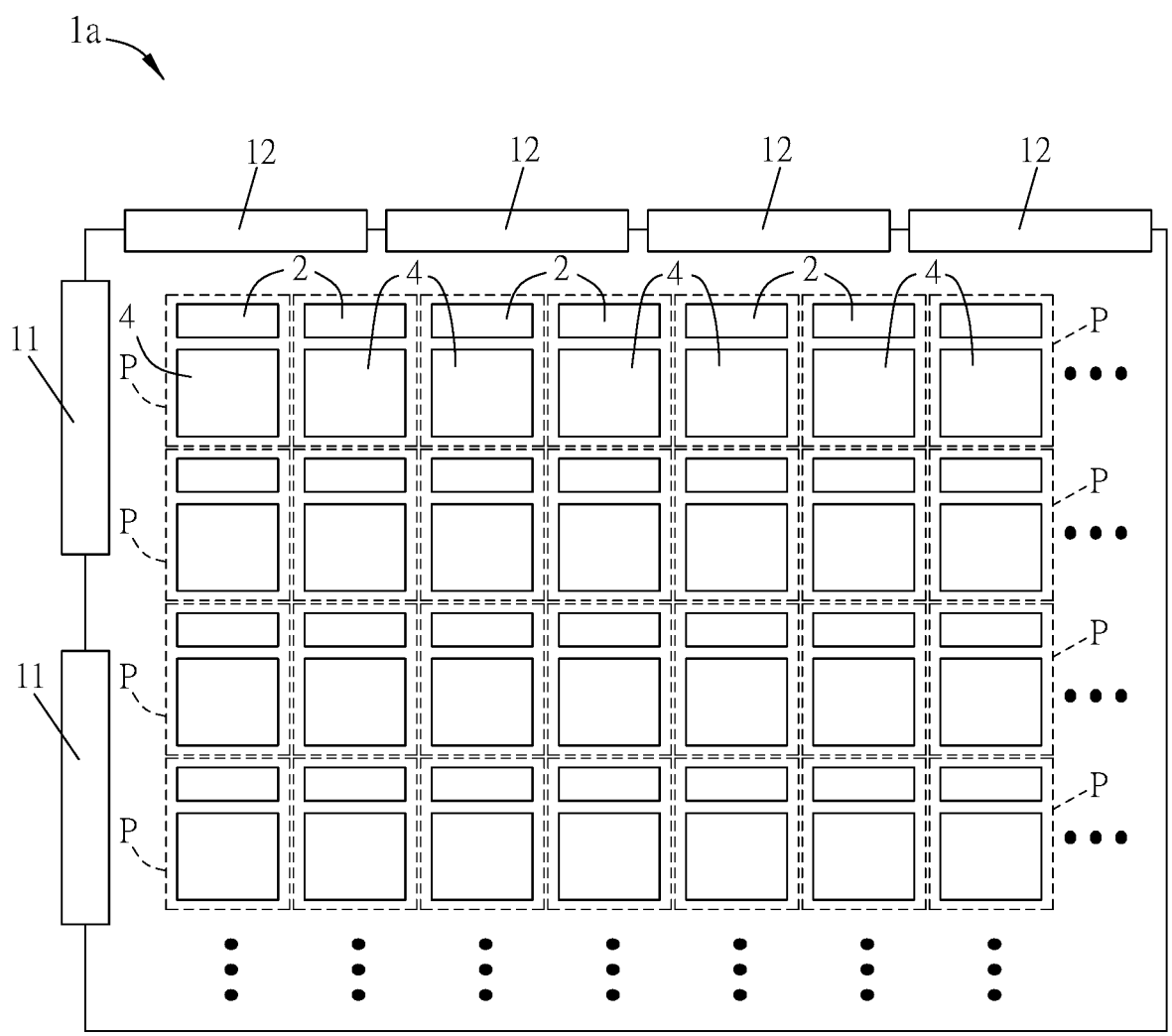
FIG. 2G is a schematic diagram showing the layout of the electronic device according to an embodiment of this disclosure.

In the embodiment of FIG. 2F, one sub matrix unit 2, one surface mount device 4, and the driving circuit board 3 can be combined as one display pixel in a large-sized display apparatus (the electronic device). In this case, a plurality of surface mount devices 4 and the corresponding sub matrix units 2 can construct a plurality of display pixels, which can be arranged in a 1D or 2D array. FIG. 2G is a schematic diagram showing the layout of an electronic device 1a according to an embodiment of this disclosure. For example, the electronic device 1a is a display apparatus. In the electronic device 1a (a display apparatus) of FIG. 2G a plurality of first conductive lines (not illustrated) are provided to connect a plurality of horizontally arranged display pixels P, and then connect to the scan driver (e.g. a driving IC) 11, which is disposed in the non-display area. For example, these components can be electrically connected by COF (chip on film) or COG (chip on glass) (the connecting lines are not illustrated). Besides, the second conductive lines (not illustrated) are provided to connect a plurality of vertically arranged display pixels P, and then connect to the data driver (e.g. a driving IC) 12, which is disposed in the non-display area, thereby an AM LED display apparatus is formed. Compared with the conventional PM display apparatus, the electronic device 1a of this embodiment needs less amount of driving ICs, so that the manufacturing cost of the electronic device 1a can be reduced.

Figure 2H:
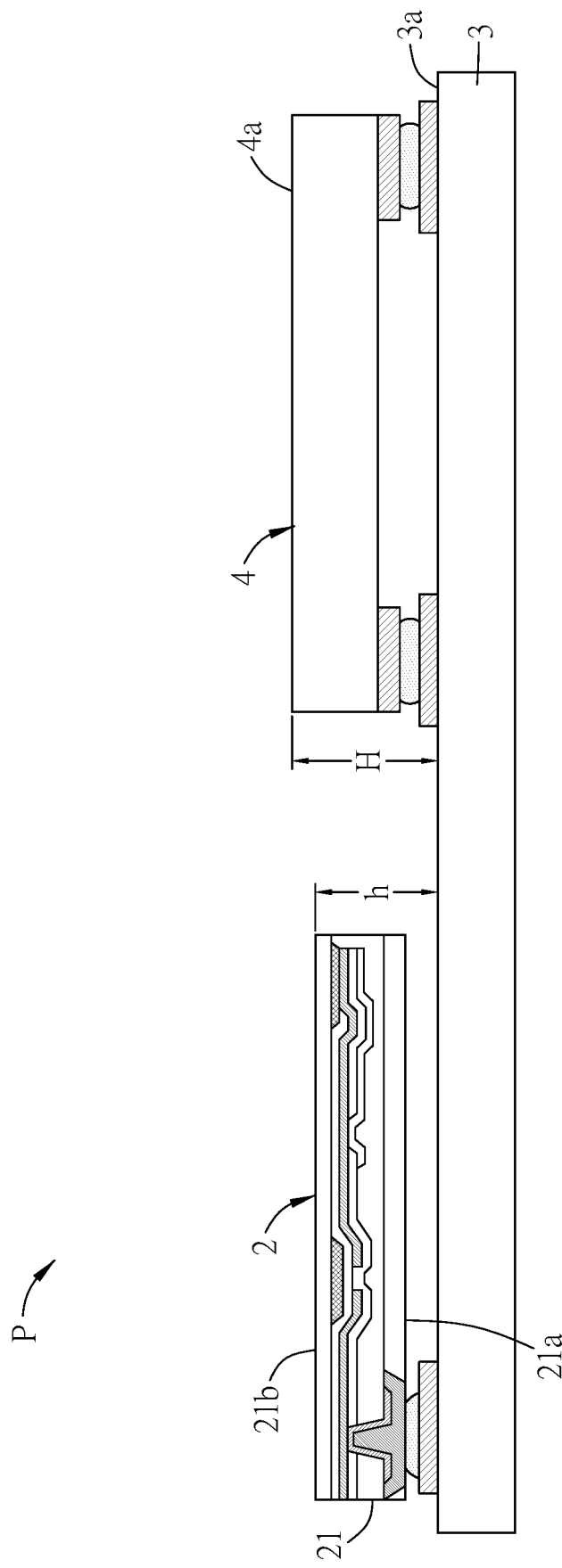
FIG. 2H is a sectional view of one display pixel of the electronic device along the line 2H-2H of FIG. 2F.

FIG. 2H is a sectional view of one display pixel P of the electronic device 1 along line 2H-2H of FIG. 2F. As shown in FIG. 2H, the substrate 21 defines an operation face 21a and an opposite face 21b contrary to the operation face 21a. The thin-film circuit and the first connecting pads are disposed on the operation face 21a of the substrate 21. The driving circuit board 3 defines a loading face 3a, and the second connecting pads, the first conductive line and the second conductive line all together arranged on the loading face 3a. The surface mount device 4 defines a top 4a contrary to the loading face 3a of the driving circuit board 3. In this embodiment, a first height h is defined between the opposite face 21b of the sub matrix unit 2 and the loading face 3a of the driving circuit board 3, and a second height H is defined between the top 4a of the surface mount device 4 and the loading face 3a of the driving circuit board 3. The second height H is no less than the first height h. For further elaboration, the wording "the second height H is no less than the first height h" means the second height H is equal to or greater than the first height h. To be noted, the surface mount device 4 and the sub matrix unit 2 are not limited to a flip-typed device. For further elaboration, as the sub matrix unit 2 is arranged upside down in this embodiment, the operation face 21a, on which the thin-film circuit(s) and the first connecting pads are disposed, of the substrate 21 faces the loading face 3a of the driving circuit board 3; as the sub matrix unit 2 is arranged regularly (not illustrated), the opposite face 21b, contrary to the operation face 21a, of the substrate 21 faces the loading face 3a of the driving circuit board 3. Either the operation face 21a or the opposite face 21b of the substrate 21 faces the loading face 3a of the driving circuit board 3, the other face, facing up and contrary to the loading face 3a of the driving circuit board 3 is defined as the uppermost face of the substrate 21. The first height h is defined between the uppermost face, the opposite face 21b in this case, of the sub matrix unit 2 and the loading face 3a of the driving circuit board 3, and the second height H is no less than the first height h.

In some embodiments, the pitch between the display pixels P of the electronic device 1a can be between 0.5 mm and 5 mm. Accordingly, the electronic device 1a can be defined as a fine pitch AM LED display apparatus. In some embodiments, the pitch between the display pixels P of the electronic device 1a is, for example, 1 mm, the size of the surface mount device 4 would be, for example, 0.55 mm×0.55 mm, and the size of the third connecting pads 42 would be, for example, 0.2 mm×0.2 mm. The pitch between the display pixels P of the electronic device 1a is not limited thereto.

Figure 3A:
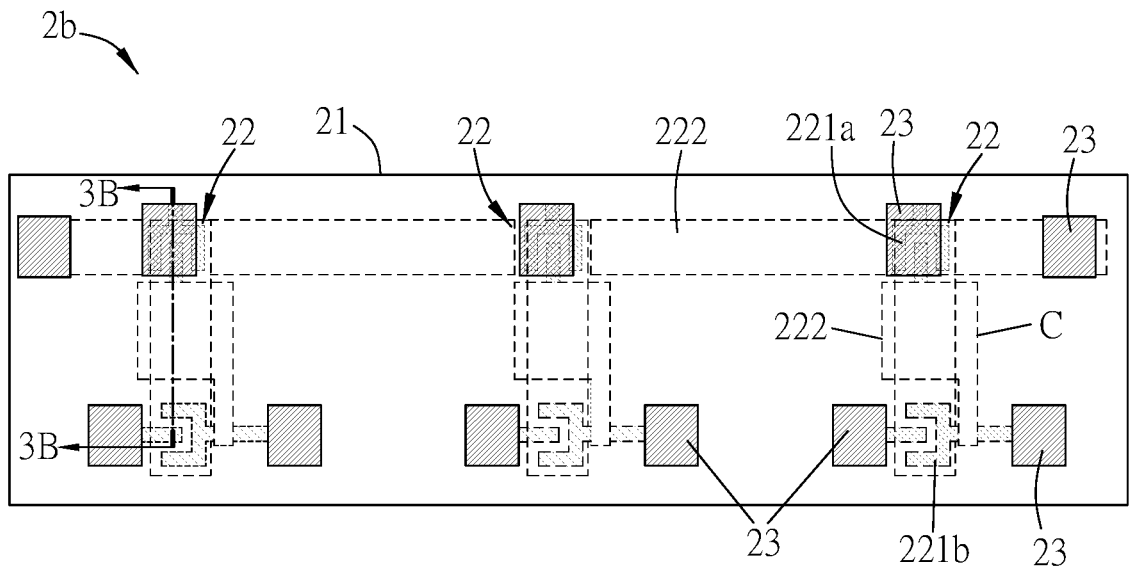
FIG. 3A is a schematic diagram showing the layout of the sub-matrix unit according to another embodiment of this disclosure.
Figure 3B:
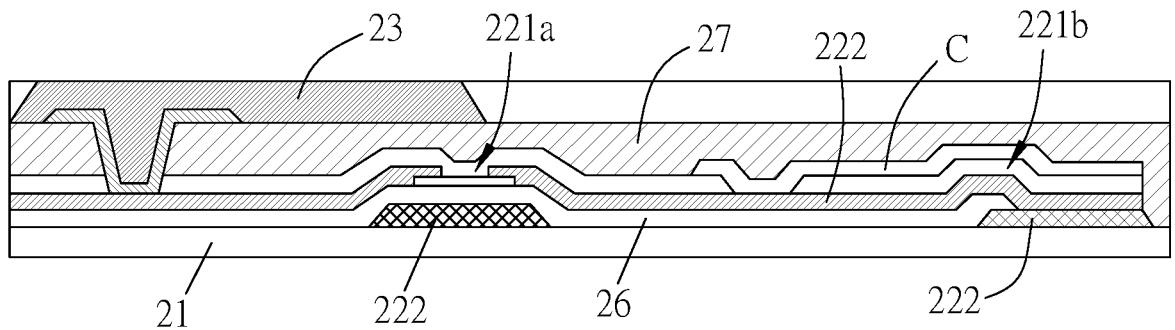
FIG. 3B is a sectional view of the sub-matrix unit of FIG. 3A along the line 3B-3B.
Figure 3C:
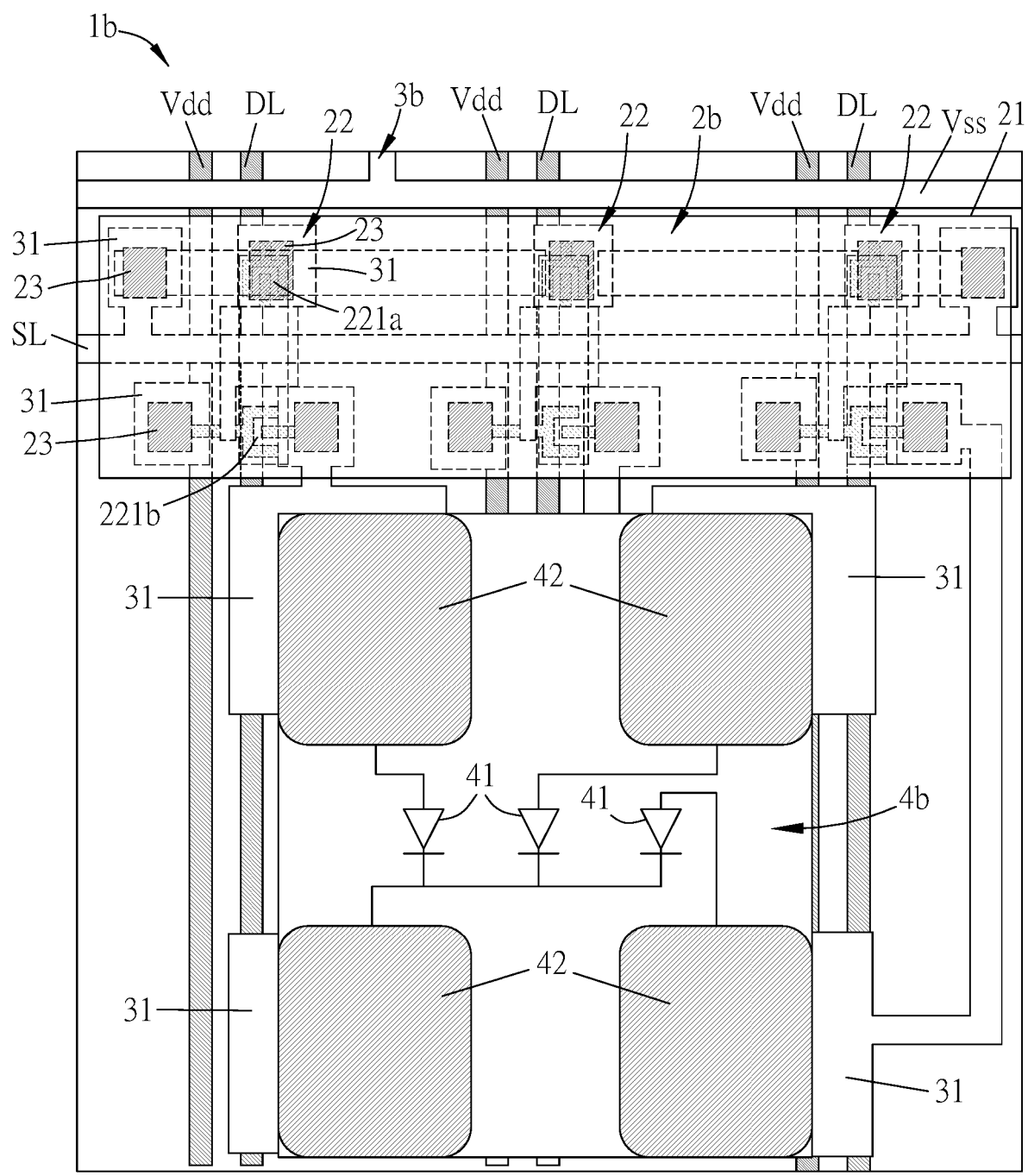
FIG. 3C is a schematic diagram showing the layout of the display apparatus according to another embodiment of this disclosure.

FIG. 3A is a schematic diagram showing the layout of a sub matrix unit 2b according to another embodiment of this disclosure, FIG. 3B is a sectional view of the sub matrix unit 2b of FIG. 3A along the line 3B-3B, and FIG. 3C is a schematic diagram showing the layout of the electronic device 1b according to another embodiment of this disclosure. In this embodiment, the electronic device 1b is a display apparatus.

Referring to FIGS. 3A to 3C, the manufacturing procedure and components of the sub matrix unit 2b and the connections of the components in this embodiment are mostly the same as those of the sub matrix unit 2 of the previous embodiment. Different from the previous embodiment, with viewing from the vertical direction along the line 3B-3B of the substrate 21, the sub matrix unit 2b has one first connecting pad 23 at least partially overlapped with the corresponding thin-film transistor 221a (or 221b) (see FIGS. 3A and 3B). Since at least a part of the thin-film transistor 221a (or 221b) is disposed under the first connecting pad 23 (see FIG. 3B), the total size of the display pixel can be shrunk to, for example, 0.85 mm×0.85 mm. Thus, the pitch between the display pixels can be, for example, 0.85 mm.

Figure 4A:
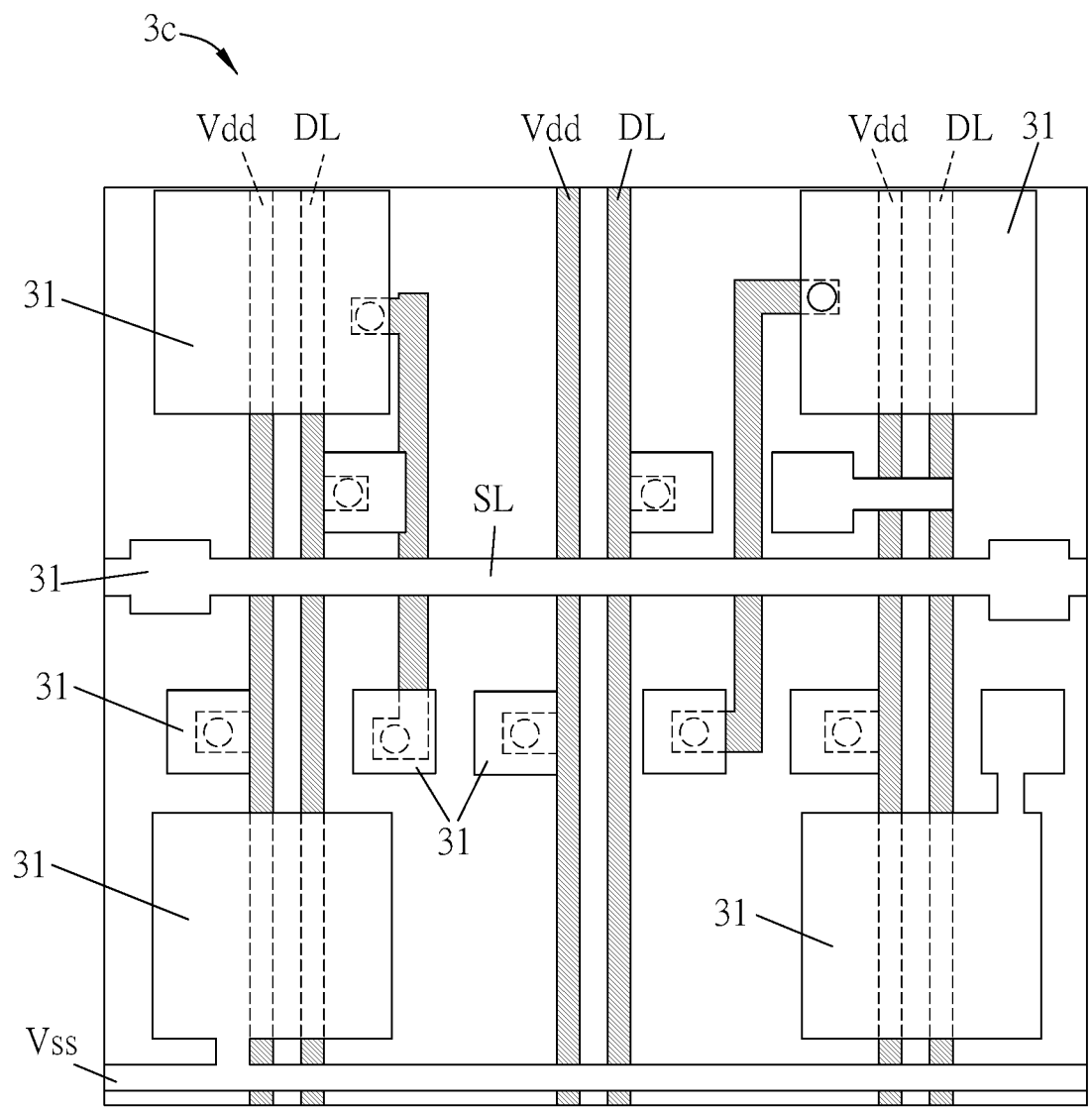
FIG. 4A is a schematic diagram showing the layout of the driving circuit board according to another embodiment of this disclosure.
Figure 4B:
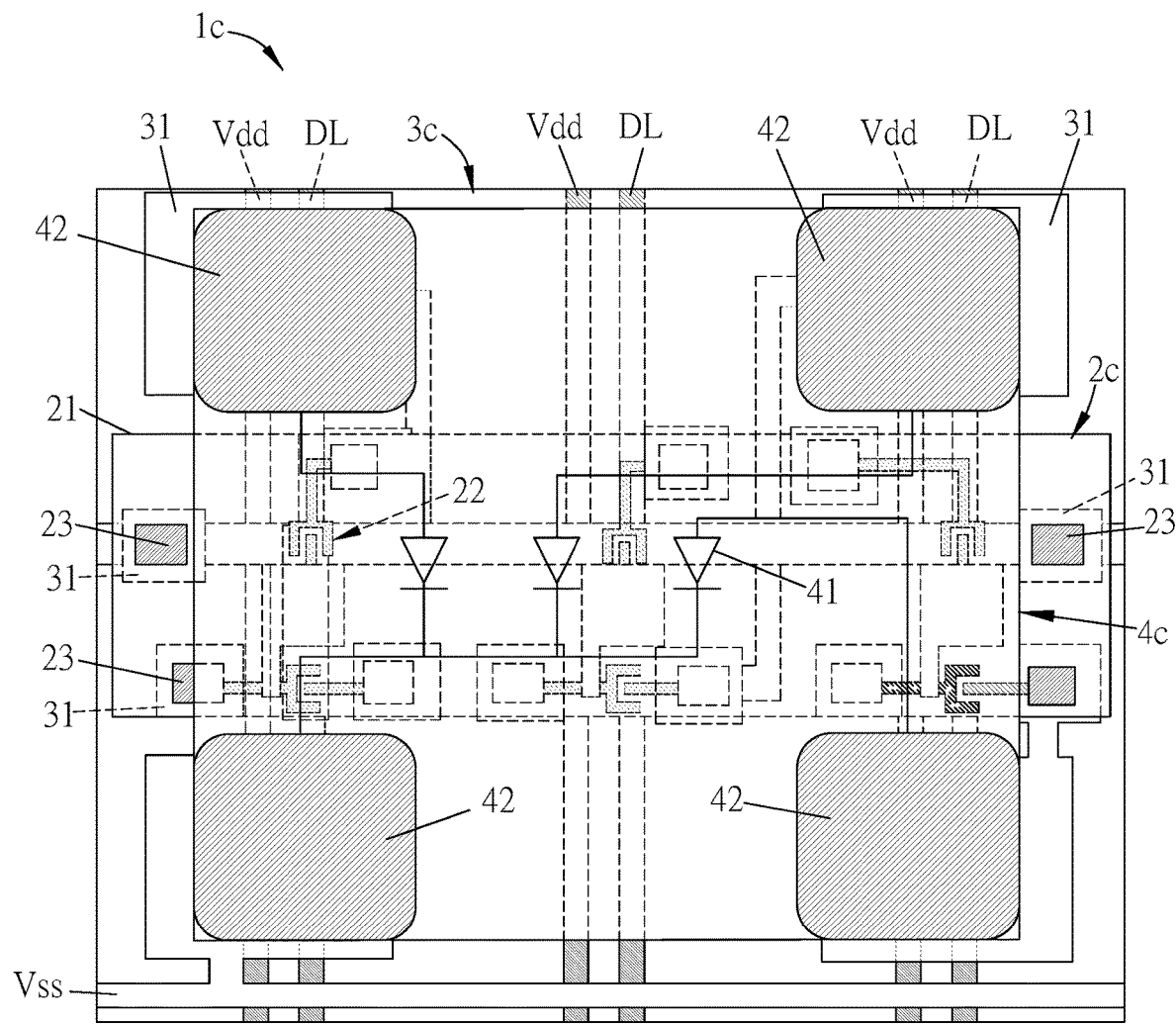
FIG. 4B is a schematic diagram showing the layout of the display apparatus according to another embodiment of this disclosure.

FIG. 4A is a schematic diagram showing the layout of the driving circuit board 3c according to another embodiment of this disclosure, and FIG. 4B is a schematic diagram showing the layout of the electronic device 1c according to another embodiment of this disclosure. In this embodiment, the electronic device 1c is a display apparatus.

Referring to FIGS. 4A and 4B, the manufacturing procedure and components of the electronic device 1c and the connections of the components in this embodiment are mostly the same as those of the electronic device 1 of the previous embodiment. Different from the previous embodiment, in the electronic device 1c of this embodiment, the sub matrix unit 2c and the surface mount device 4c are at least partially overlapped with each other. Accordingly, when viewing from the top of the driving circuit board 3c, the surface mount device 4c, the sub matrix unit 2c and the driving circuit board 3c are overlapped with each other. In this embodiment, the sub matrix unit 2c is correspondingly attached on the driving circuit board 3c, and then the surface mount device 4c is also correspondingly attached to the driving circuit board 3c. Thus, the surface mount device 4c can be overlapped on the sub matrix unit 2c and the driving circuit board 3c. To be noted, the circuit layout of the driving circuit board 3c should be adjusted for the overlapped sub matrix unit 2c and surface mount device 4c.

Since the sub matrix unit 2c and the surface mount device 4c are at least partially overlapped (see FIG. 4B), the pitch between the display pixels of the electronic device 1c can be shortened to, for example, 0.8 mm. In addition, the substrate 21 of the sub matrix unit 2c is made of PI, and the thickness thereof is, for example, less than 50 μm. Accordingly, the entire thickness of the sub matrix unit 2c can be, for example, less than 100 μm. In addition, the size of the surface mount device 4c would be, for example, 0.7 mm×0.7 mm, and the size of the third connecting pad 42 would be, for example, 0.2 mm×0.2 mm.

Figure 5A:
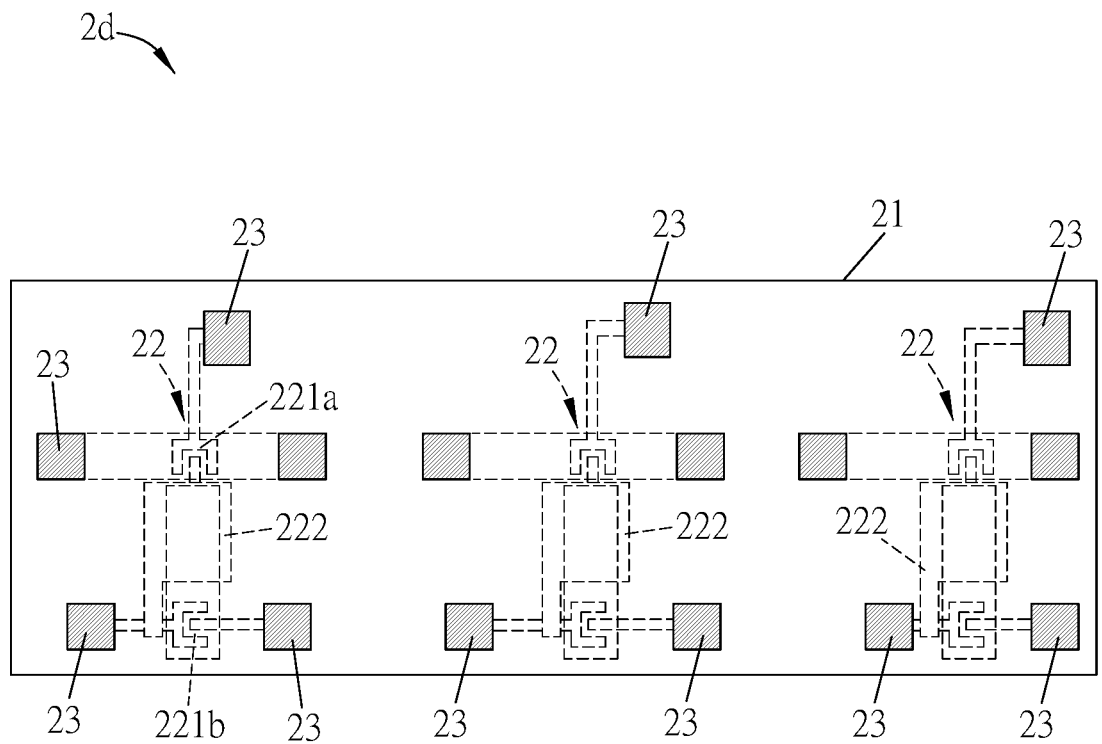
FIG. 5A is a schematic diagram showing the layout of the sub-matrix unit according to another embodiment of this disclosure.
Figure 5B:
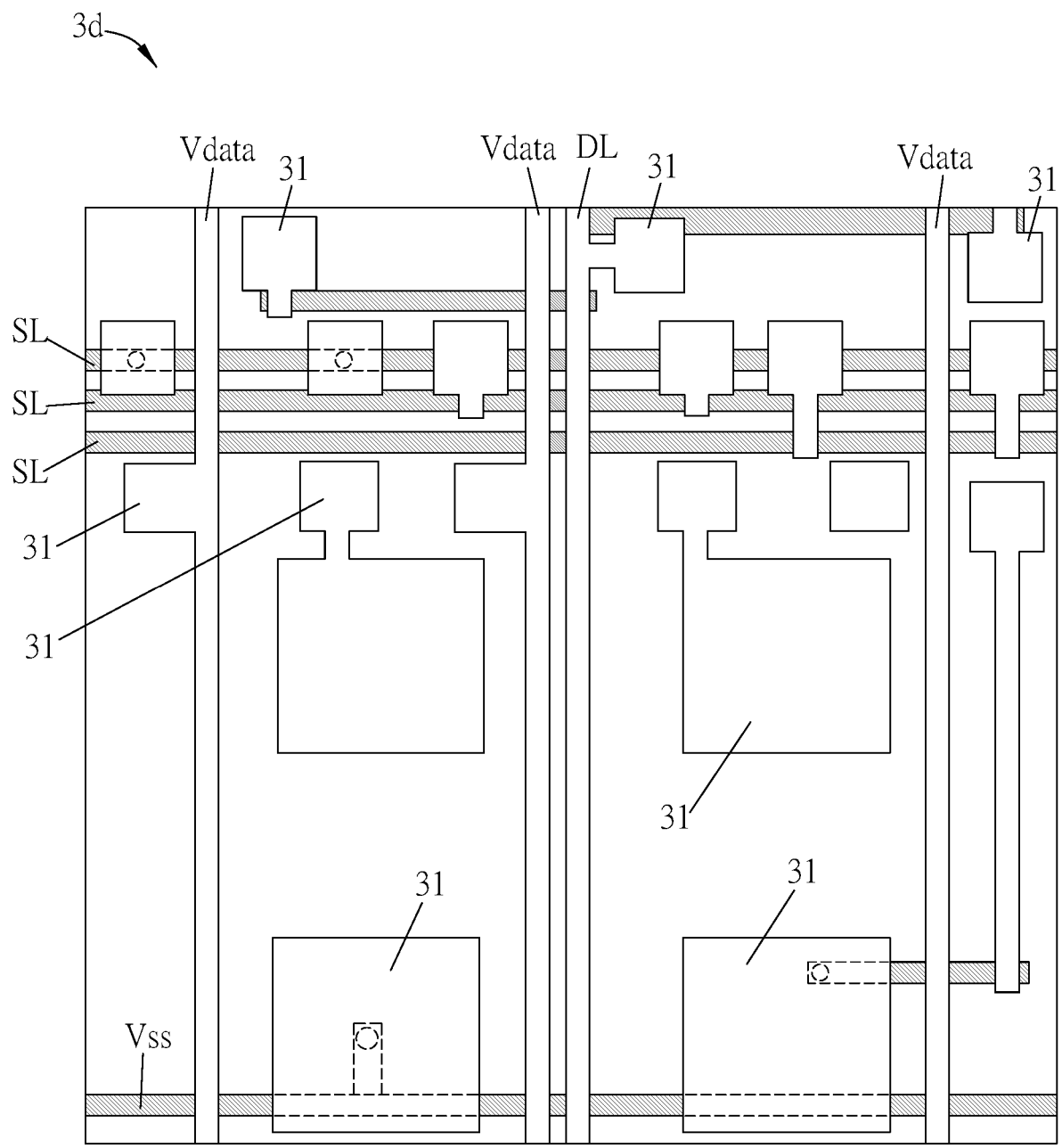
FIG. 5B is a schematic diagram showing the layout of the driving circuit board according to another embodiment of this disclosure.
Figure 5C:
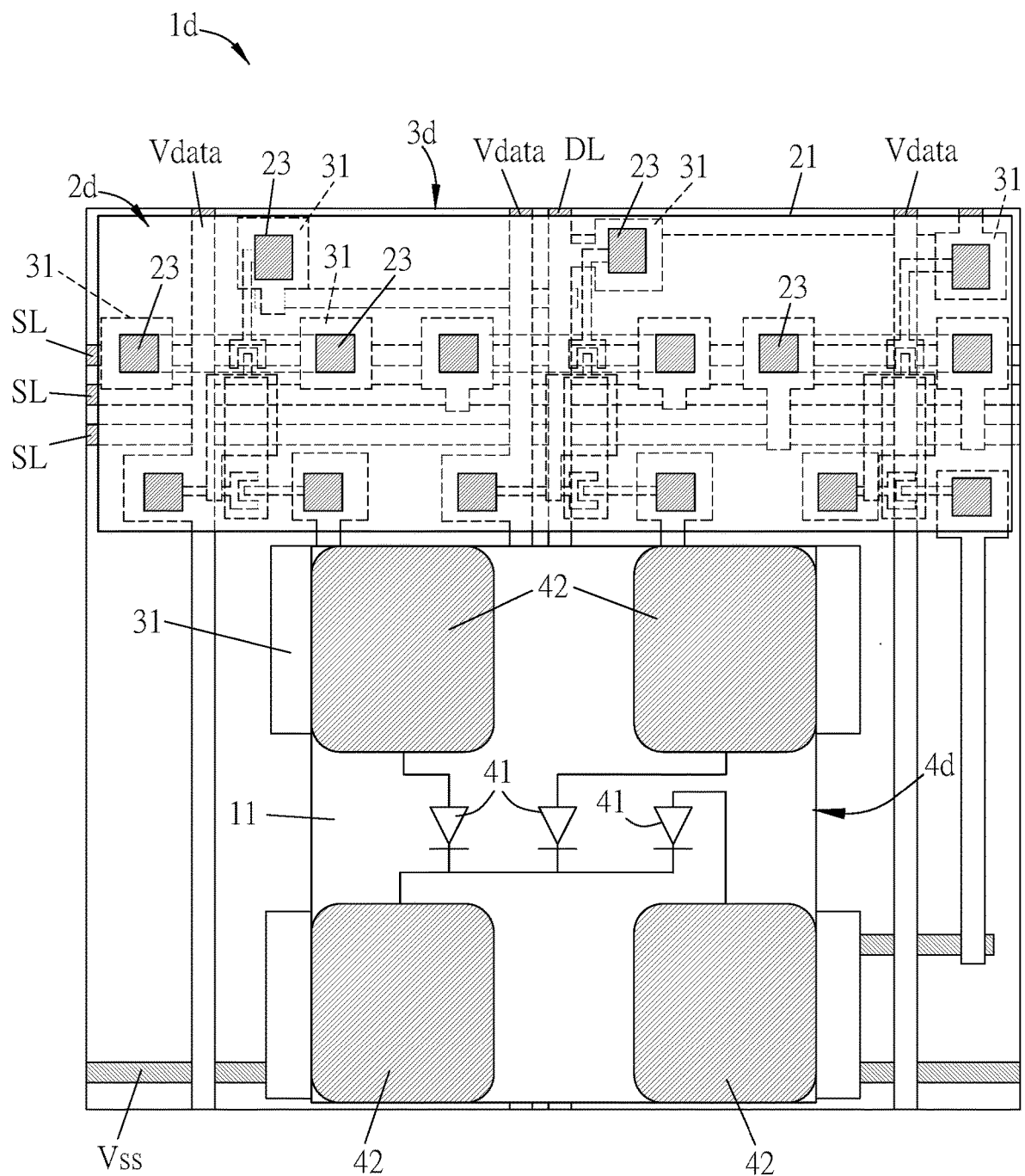
FIG. 5C is a schematic diagram showing the layout of the display apparatus according to another embodiment of this disclosure.

FIG. 5A is a schematic diagram showing the layout of the sub matrix unit 2d according to another embodiment of this disclosure, FIG. 5B is a schematic diagram showing the layout of the driving circuit board 3d according to another embodiment of this disclosure, and FIG. 5C is a schematic diagram showing the layout of the electronic device 1d according to another embodiment of this disclosure. In this embodiment, the electronic device 1d is a display apparatus.

As shown in FIG. 5A, the manufacturing procedure and components of the sub matrix unit 2d and the connections of the components in this embodiment are mostly the same as those of the sub matrix unit 2 of the previous embodiment. Different from the previous embodiment, the three thin-film circuits 22 of the sub matrix unit 2d are not electrically connected (electrically isolated). As shown in FIG. 5B, the layout of the driving circuit board 3d is modified in correspondence with the layout of the changed sub matrix unit 2d. In this embodiment, the driving circuit board 3d comprises three first conductive lines (scan lines SL) and one second conductive line (data line DL).

As shown in FIG. 5C, the manufacturing procedure and components of the electronic device 1d and the connections of the components in this embodiment are mostly the same as those of the electronic device 1 of the previous embodiment. Different from the previous embodiment, the electronic device 1d comprises three first conductive lines (scan lines SL) and one second conductive line (data line DL). The thin-film transistors 221a and 221b of three thin-film circuits 22 of the sub matrix unit 2d are electrically connected with three first conductive lines (scan lines SL) of the driving circuit board 3 through the second connecting pads 31 and the corresponding first connecting pads 23, respectively. In addition, the thin-film transistors 221a and 221b of three thin-film circuits 22 are electrically connected with one second conductive line (data line DL) of the driving circuit board 3 through the second connecting pads 31 and the corresponding first connecting pads 23. When the data driver IC for transmitting data signals is more expensive and the scan driver IC for transmitting scan signals is cheaper, the configuration of the electronic device 1d of this embodiment (comprising three first conductive lines (scan lines SL) and one second conductive line (data line DL) can use a less amount of data driver ICs, thereby the manufacturing cost of the electronic device (a display apparatus) is reduced.

Figure 6A:
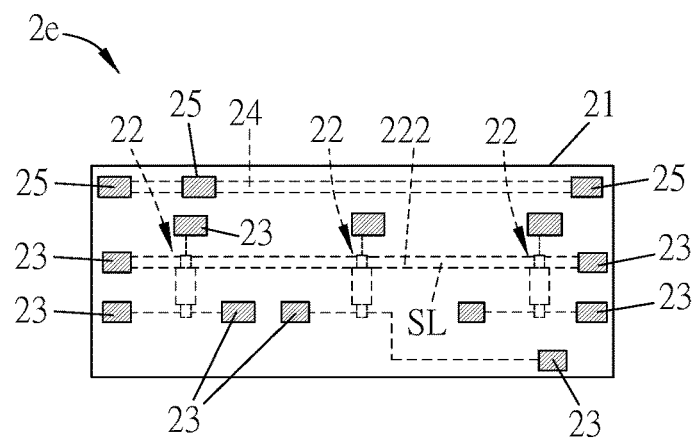
FIG. 6A is a schematic diagram showing the layout of the sub-matrix unit according to another embodiment of this disclosure.
Figure 6B:
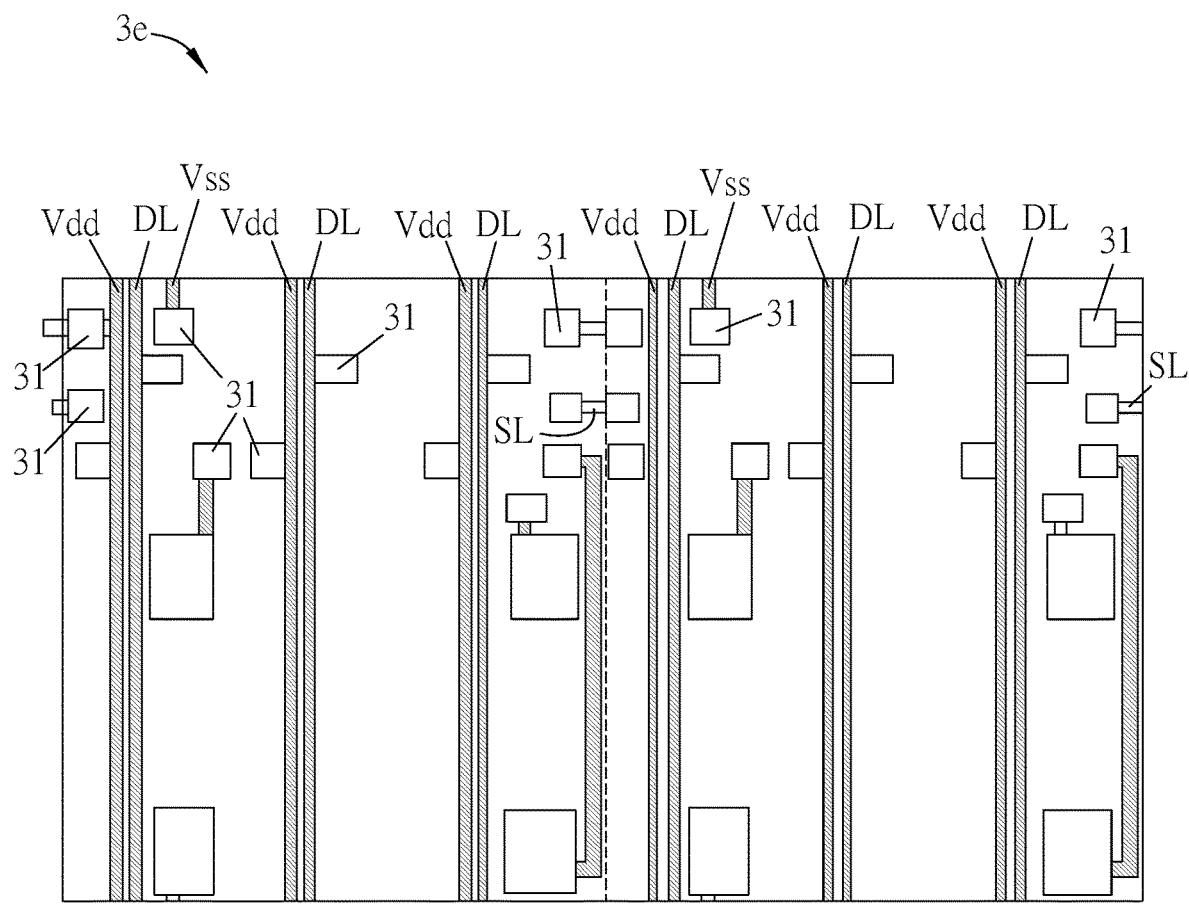
FIG. 6B is a schematic diagram showing the layout of the driving circuit board according to another embodiment of this disclosure.
Figure 6C:
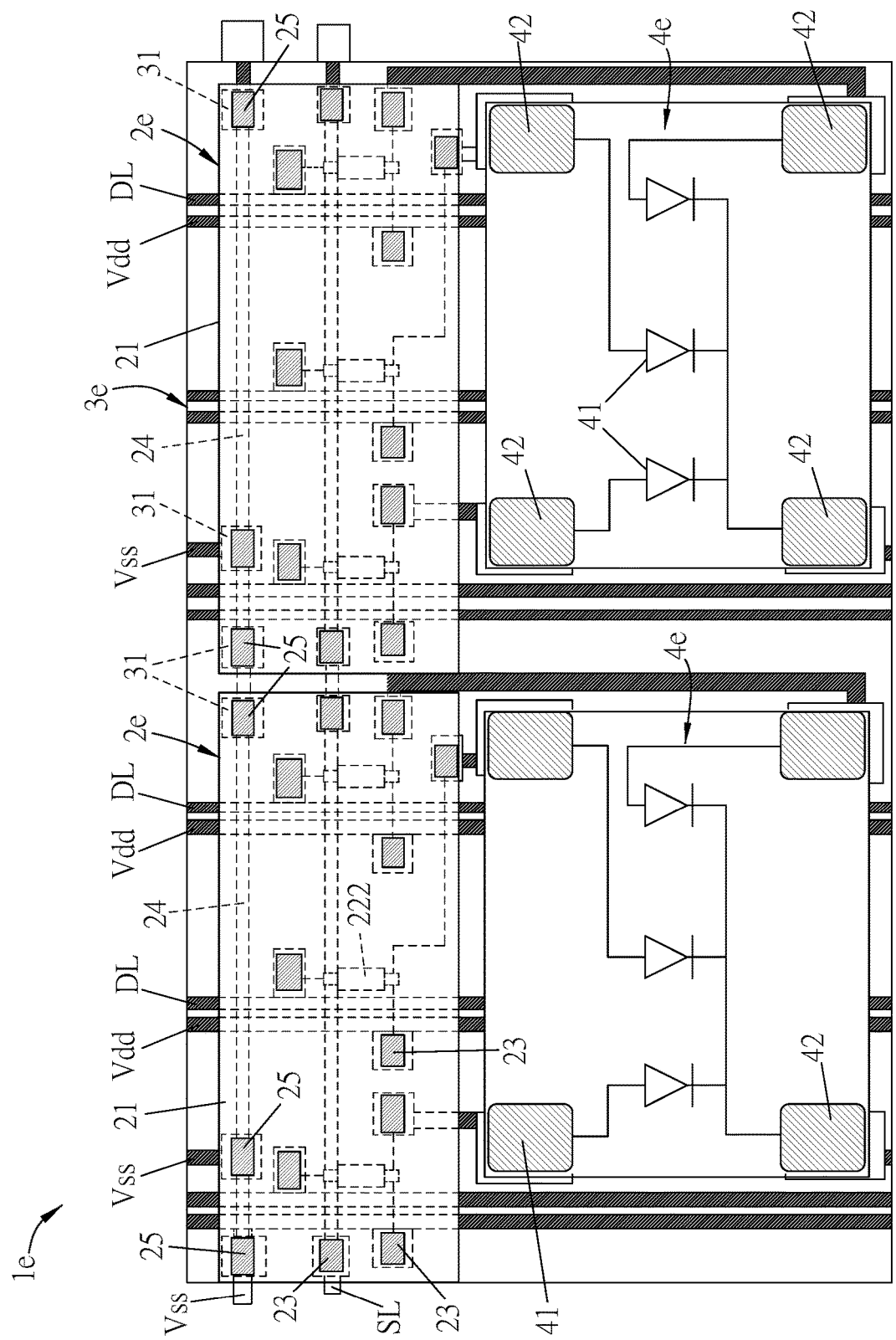
FIG. 6C is a schematic diagram showing the layout of the display apparatus according to another embodiment of this disclosure.

FIG. 6A is a schematic diagram showing the layout of a sub matrix unit 2e according to another embodiment of this disclosure, FIG. 6B is a schematic diagram showing the layout of a driving circuit board 3e according to another embodiment of this disclosure, and FIG. 6C is a schematic diagram showing the layout of an electronic device 1e according to another embodiment of this disclosure. In this embodiment, FIG. 6A shows one sub matrix unit 2e, FIG. 6B shows that the driving circuit board 3e comprises two driving circuits, and FIG. 6C shows that the electronic device 1e comprises two display pixels. In this embodiment, the electronic device 1e is a display apparatus.

Referring to FIGS. 6A and 6B, the manufacturing procedures and components of the sub matrix unit 2e and the driving circuit board 3e and the connections of the components in this embodiment are mostly the same as those of the sub matrix unit 2 and the driving circuit board 3 of the previous embodiment. Different from the previous embodiment, the driving circuit board 3e of this embodiment is a single layer printed circuit board, which is cheaper. For cooperating with the single layer driving circuit board 3e, the sub matrix unit 2e of this embodiment further comprises at least one trace 24 and a plurality of fourth connecting pads 25, which are disposed on the substrate 21 and connected with other. Of course, the layout of the driving circuit board 3e must be adjusted according to the modified layout of the sub matrix unit 2e.

As shown in FIG. 6C, in the electronic device 1e, the ground line Vss of the driving circuit board 3e comprises a plurality of conductive segments, in which the conductive segments are electrically connected with each other through the trace 24 and the fourth connecting pads 25. In this embodiment, the fourth connecting pads 25 of the sub matrix unit 2e are connected to the corresponding ones of the second connecting pads 31 of the driving circuit board 3e, and the trace 24 is used as a cross connection in cooperating with the single layer driving circuit board 3e (comprising the conductive segments), so that the conductive segments of the driving circuit board 3e can connect with each other. To be noted, this embodiment utilizes the single layer driving circuit board 3e so as to reduce the entire cost of the electronic device 1e.

Figure 7:
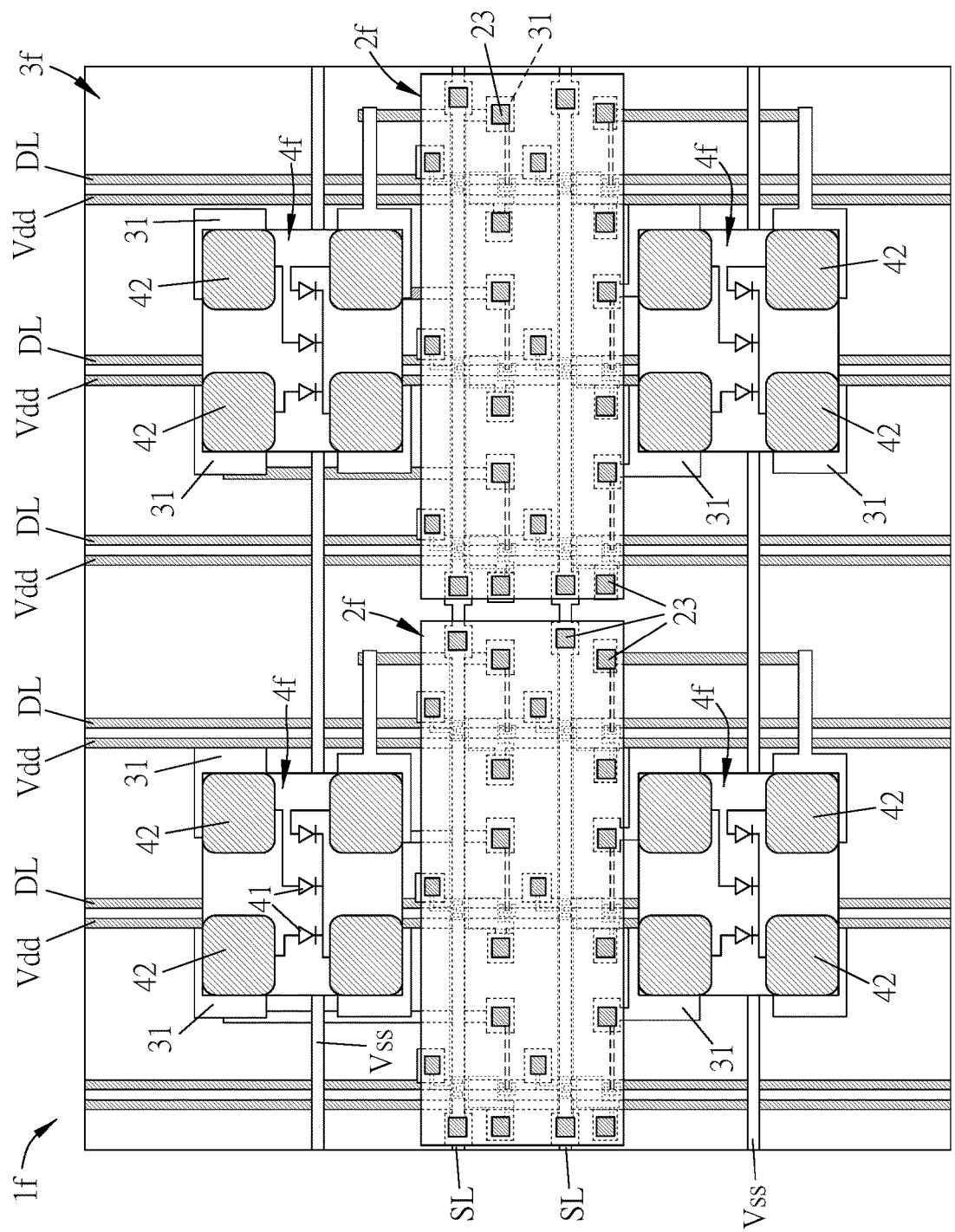
FIGS. 7 and 8 are schematic diagrams showing the layouts of the display apparatuses according to other embodiments of this disclosure.
Figure 8:
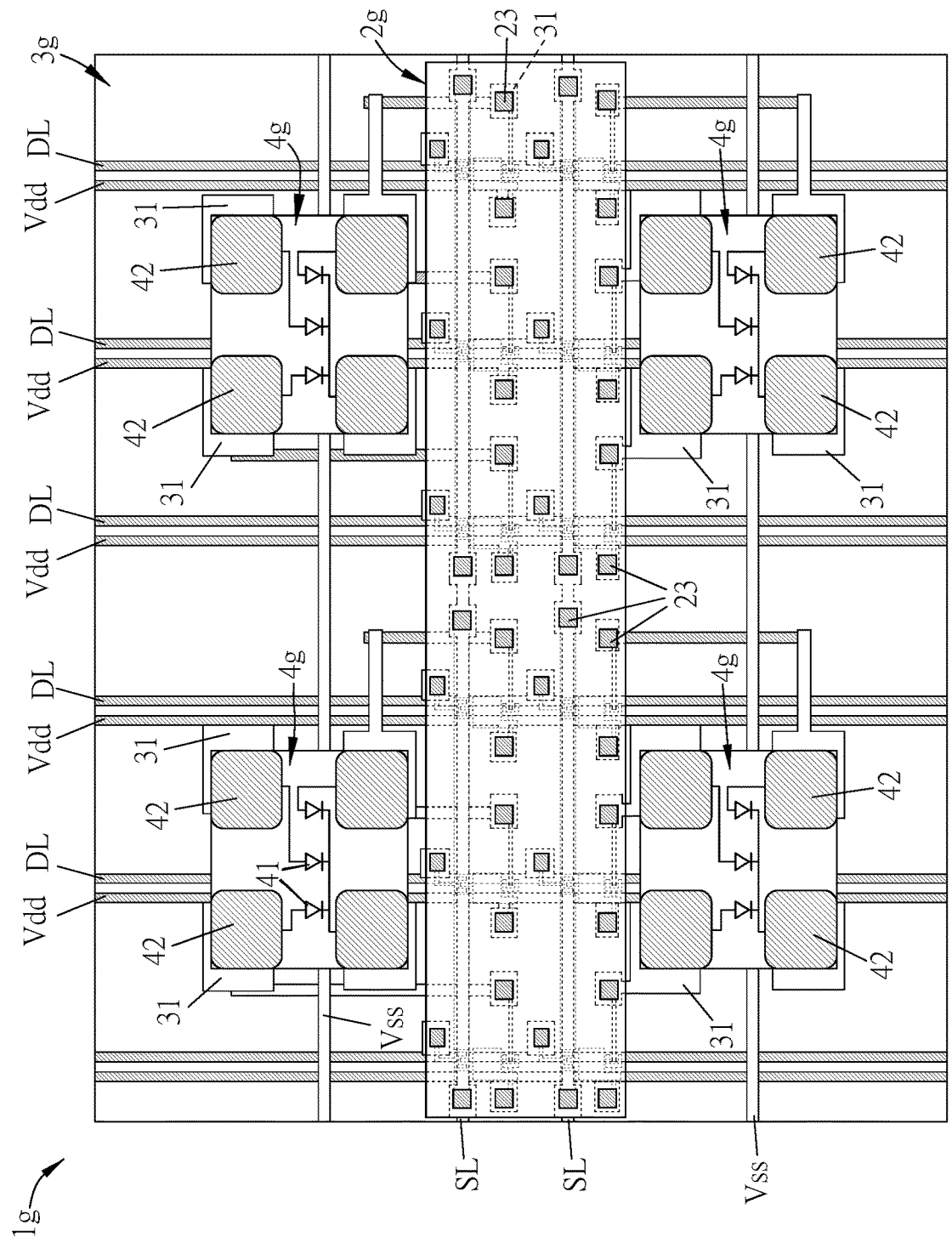

FIGS. 7 and 8 are schematic diagrams showing the layouts of the electronic devices 1f and 1g according to other embodiments of this disclosure. FIG. 7 shows two sub matrix units 2f and four surface mount devices 4f, which are disposed on the driving circuit board 3f. FIG. 8 shows one sub matrix unit 2g and four surface mount devices 4g, which are disposed on the driving circuit board 3g. In these embodiments, the electronic devices 1f and 1g are display apparatuses.

Referring to FIG. 7, the manufacturing procedure and components of the electronic device 1f and the connections of the components in this embodiment are mostly the same as those of the electronic device 1 of the previous embodiment. Different from the previous embodiment, in the electronic device 1f of this embodiment, the sub matrix unit 2f comprises six thin-film circuits 22 (six 2T1C circuits). Of course, the layout and connecting pads of the driving circuit board 3f must be adjusted according to the amount of the thin-film circuits of the sub matrix unit 2f. In this embodiment, two surface mount devices 4f are disposed at two opposite sides of the sub matrix unit 2f, and each sub matrix unit 2f can drive six light-emitting diodes 41 of the two surface mount devices 4f to emit light. Since each sub matrix unit 2f can control multiple (two) surface mount devices 4f, the amount of the surface mount processes of the electronic device 1f can be reduced (down to 50%).

Referring to FIG. 8, the manufacturing procedure and components of the electronic device 1g and the connections of the components in this embodiment are mostly the same as those of the electronic device 1f of the previous embodiment. Different from the previous embodiment, in the electronic device 1g of this embodiment, the sub matrix unit 2f comprises twelve thin-film circuits 22 (twelve 2T1C circuits). Of course, the layout and connecting pads of the driving circuit board 3g must be adjusted according to the amount of the thin-film circuits of the sub matrix unit 2g. In this embodiment, four surface mount devices 4g are disposed at two opposite sides of the sub matrix unit 2g, and each sub matrix unit 2g can drive twelve light-emitting diodes 41 of the four surface mount devices 4g to emit light. Since each sub matrix unit 2g can control multiple (four) surface mount devices 4g, the amount of the surface mount processes of the electronic device 1g can be reduced (down to 25%). In addition, the ratio of the amounts of the sub matrix units to the amounts of the surface mount devices are not limited to the above examples (1:1, 1:2, or 1:4), and can be modified based on the design.

In the conventional thin-film transistor driving photoelectric element, for example, when the thin-film transistor of the thin-film transistor substrate is used to drive the light-emitting diode to emit light, it is necessary to create one design (in size or function) for each product, and the expensive thin-film transistor manufacturing process, photomask, substrate and material are adopted. This is not conducive to the various and frequently changed product requirements. However, the electronic device and the manufacturing method thereof according to the present disclosure do not need to create various designs for the products with different sizes or functions with using the expensive thin-film transistor manufacturing process, photomask, substrate and material, thereby having the advantages of simple process and low cost. In addition, the application of this disclosure is more flexible and can be suitable for various product requirements.

In addition, this disclosure also provides an electronic device, which comprises at least one sub matrix unit and a driving circuit board. The at least one sub matrix unit includes a substrate, a plurality of thin-film circuits, and a plurality of first connecting pads. The thin-film circuits and the first connecting pads are disposed on the substrate. Each of the thin-film circuits includes at least one thin-film transistor and at least one conductive line. The thin-film transistor is electrically connected with the conductive line, and the first connecting pads are electrically connected with the thin-film transistor through the conductive line. The sub matrix unit is disposed on the driving circuit board. The driving circuit board includes a plurality of second connecting pads, at least one first conductive line, and at least one second conductive line. The second connecting pads corresponds to ones of the first connecting pads and connect to the corresponding ones of the first connecting pads in a respective manner, and the first conductive line and the second conductive line are correspondingly and electrically connected with the first connecting pads through the second connecting pads.

To sum up, in the electronic device of this disclosure, the thin-film transistors are electrically connected with the conductive lines of the thin-film circuits of the sub matrix unit. The first connecting pads are electrically connected with the thin-film transistors through the conductive lines. In addition, the second connecting pads of the driving circuit board corresponds to ones of the first connecting pads to electrically connect with the corresponding ones of the first connecting pads in the respective manner. The first conductive lines and the second conductive lines are electrically connected with the first connecting pads through the second connecting pads; the surface mount device is electrically connected with the corresponding ones of the first connecting pads through the second connecting pads, in which the corresponding ones of the second connecting pads connect with the surface mount device. Therefore, the electronic device (e.g. a LED display apparatus) of one embodiment according to this disclosure can be an AM (active matrix) display apparatus, but not limited thereto. Compared with the conventional PM display apparatus, the AM (active matrix) display apparatus according to this disclosure can reduce the manufacturing cost of the electronic device but keep remaining the size of the electronic device.

In addition, the electronic device of this disclosure can increase the size of the display area by reducing the amount of the driving ICs, and can break through the small size limitation of, for example, the conventional PM display apparatus and increase the size of the display area according to market demand.

Moreover, the second height defined between the top of the at least one surface mount device and the loading face of the driving circuit board is no less than the first height defined between the uppermost face of the at least one sub matrix unit and the loading face of the driving circuit board.

Furthermore, in the electronic device according to one embodiment of this disclosure, at least one sub matrix unit in correspondence with at least one surface mount device can construct at least one electronic unit; specifically, in the electronic device according to another one embodiment of this disclosure, at least one sub matrix unit in correspondence with at least one surface mount device can construct at least one display pixel. There are various embodiments, but not limited thereto: one or more sub matrix unit(s) arranged on the driving circuit board can construct one or more electronic unit(s), one sub matrix unit in correspondence with one surface mount device can construct one electronic unit (such as a display pixel), one sub matrix unit in correspondence with a plurality of surface mount devices can construct a plurality of electronic units (such as display pixels), or two or more sub matrix units in correspondence with a plurality of surface mount devices can construct a plurality of electronic units (such as display pixels). In some embodiments, the surface mount device can be of variety, such as a light-emitting member, a proximity sensor, an interface device, a pressure sensor, or any electronic piece not limited thereto but adapted to surface mount technology. These configurations can achieve the advantages of low cost and efficient combinations. As a result, there is no need to design a specific manufacturing process for the size of each final product in this disclosure. Accordingly, the manufacturing process according to this disclosure is simplified and budget, and provides the flexibility for various product requirements.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
   at least one sub matrix unit comprising a substrate, at least one thin-film circuit and a plurality of first connecting pads, wherein the at least one thin-film circuit and the first connecting pads are disposed on the substrate, the at least one thin-film circuit comprises at least one thin-film transistor and at least one conductive line, the at least one thin-film transistor is electrically connected with the conductive line, the first connecting pads are electrically connected with the thin-film transistor through the conductive line;
   a driving circuit board, wherein the sub matrix unit is disposed on the driving circuit board, the driving circuit board defines a loading face, and comprises a plurality of second connecting pads, at least one first conductive line, and at least one second conductive line all together arranged on the loading face, the second connecting pads are corresponding to ones of the first connecting pads and electrically connected to the corresponding ones of the first connecting pads in a respective manner, the first connecting pad is disposed between the second connecting pad and the substrate, and the first conductive line and the second conductive line are correspondingly and electrically connected with the first connecting pads through the second connecting pads; and
   at least one surface mount device disposed on the loading face of the driving circuit board and being adjacent to the at least one sub matrix unit, wherein the surface mount device is electrically connected with the corresponding ones of the first connecting pads through the corresponding ones of the second connecting pads, and the corresponding ones of the second connecting pads connect with the surface mount device; the surface mount device defines a top contrary to the loading face of the driving circuit board;
   wherein, the substrate defines an uppermost face contrary to the loading face of the driving circuit board, a first height is defined between the uppermost face of the at least one sub matrix unit and the loading face of the driving circuit board; a second height is defined between the top of the at least one surface mount device and the loading face of the driving circuit board; and the second height is no less than the first height.

2. The electronic device according to claim 1, wherein the substrate is a rigid board or a flexible board.

3. The electronic device according to claim 1, wherein the first connecting pad is disposed between the second connecting pad and the substrate.

4. The electronic device according to claim 1, wherein the surface mount device comprises a plurality of light-emitting diodes and a plurality of third connecting pads, the light-emitting diodes are disposed in correspondence with the thin-film circuits of the sub matrix unit, and the light-emitting diodes are electrically connected with corresponding ones of the second connecting pads of the driving circuit board through the third connecting pads.

5. The electronic device according to claim 1, wherein at least one of the first connecting pads is at least partially overlapped with the corresponding thin-film transistor.

6. The electronic device according to claim 1, wherein the at least one thin-film transistor of the at least one thin-film circuit is electrically connected with one of the first conductive lines of the driving circuit board.

7. The electronic device according to claim 1, wherein the at least one thin-film transistor of the at least one thin-film circuit is electrically connected with one of the second conductive lines of the driving circuit board.

8. The electronic device according to claim 1, wherein the sub matrix unit further comprises a trace and a plurality of fourth connecting pads, the trace and the fourth connecting pads are disposed on the substrate, the driving circuit board has a plurality of conductive segments, and the conductive segments are electrically connected with each other through the trace and the fourth connecting pads.

9. The electronic device according to claim 1, wherein one of the sub matrix units controls a plurality of surface mount devices.

10. An electronic device, comprising:
    at least one sub matrix unit including a substrate, at least one thin-film circuit, and a plurality of first connecting pads; wherein the at least one thin-film circuit and the first connecting pads are disposed on the substrate, the at least one thin-film circuit includes at least one thin-film transistor and at least one conductive line, the at least one thin-film transistor is electrically connected with the conductive line, and the first connecting pads are electrically connected with the at least one thin-film transistor through the conductive line; and
    a driving circuit board, on which the sub matrix unit is disposed; wherein the driving circuit board includes a plurality of second connecting pads, at least one first conductive line, and at least one second conductive line; the second connecting pads correspond to ones of the first connecting pads and electrically connect to the corresponding ones of the first connecting pads in a respective manner, and the first conductive line and the second conductive line are correspondingly and electrically connected with the first connecting pads through the second connecting pads.

11. The electronic device according to claim 10, wherein the substrate is a rigid board or a flexible board.

12. The electronic device according to claim 10, wherein the first connecting pad is disposed between the second connecting pad and the substrate.

13. The electronic device according to claim 10, wherein at least one of the first connecting pads is at least partially overlapped with the corresponding thin-film transistor.

14. The electronic device according to claim 10, wherein the at least one thin-film transistor of the at least one thin-film circuit is electrically connected with one of the first conductive lines of the driving circuit board.

15. The electronic device according to claim 10, wherein the at least one thin-film transistor of the at least one thin-film circuit is electrically connected with one of the second conductive lines of the driving circuit board.

16. The electronic device according to claim 10, wherein the sub matrix unit further comprises a trace and a plurality of fourth connecting pads, the trace and the fourth connecting pads are disposed on the substrate, the driving circuit board has a plurality of conductive segments, and the conductive segments are electrically connected with each other through the trace and the fourth connecting pads.

* * * * *